United States Patent
Son et al.

(10) Patent No.: US 11,882,742 B2
(45) Date of Patent: Jan. 23, 2024

(54) DISPLAY PANEL AND ELECTRONIC DEVICE INCLUDING SAME

(71) Applicant: LG Display Co., Ltd., Seoul (KR)

(72) Inventors: Ki Min Son, Paju-si (KR); Seok Noh, Paju-si (KR); Ki Bok Park, Paju-si (KR); Ye Won Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/901,516

(22) Filed: Sep. 1, 2022

(65) Prior Publication Data

US 2023/0071094 A1 Mar. 9, 2023

(30) Foreign Application Priority Data

Sep. 3, 2021 (KR) .................. 10-2021-0117694
Dec. 27, 2021 (KR) .................. 10-2021-0188351
Jul. 18, 2022 (KR) .................. 10-2022-0088215

(51) Int. Cl.
*G09G 3/20* (2006.01)
*H10K 59/131* (2023.01)
*G09G 3/3266* (2016.01)
*G11C 19/28* (2006.01)
*H10K 59/124* (2023.01)

(52) U.S. Cl.
CPC ....... *H10K 59/1315* (2023.02); *G09G 3/2096* (2013.01); *G09G 3/3266* (2013.01); *G11C 19/28* (2013.01); *G09G 2300/0426* (2013.01); *G09G 2310/0286* (2013.01); *G09G 2310/0291* (2013.01); *G09G 2330/021* (2013.01); *H10K 59/124* (2023.02)

(58) Field of Classification Search
CPC .............. H10K 59/12; H10K 59/1213; H10K 59/1216; H10K 59/124; G09G 2300/0426
See application file for complete search history.

(56) References Cited

U.S. PATENT DOCUMENTS 10,475,868 B2    11/2019  Park et al.
10,937,840 B2     3/2021  Lee et al.
(Continued)

FOREIGN PATENT DOCUMENTS

JP     2017173505 A    9/2017
KR    2020-0002044 A   1/2020

*Primary Examiner* — Yuzhen Shen
(74) *Attorney, Agent, or Firm* — Seed IP Law Group LLP

(57) ABSTRACT

A display panel and an electronic device including the same are disclosed. A circuit layer of the display panel includes at least a first transistor and a second transistor. The first transistor includes a first oxide semiconductor pattern, a gate electrode, a first electrode in contact with one side of the first oxide semiconductor pattern, a second electrode in contact with the other side of the first oxide semiconductor pattern, and a first-first metal pattern disposed on the substrate to overlap the first oxide semiconductor pattern. The second transistor includes a second oxide semiconductor pattern, a gate electrode, a first electrode in contact with one side of the second oxide semiconductor pattern, a second electrode in contact with the other side of the second oxide semiconductor pattern, a first-second metal pattern disposed on the substrate to overlap the second oxide semiconductor pattern, and a second metal pattern disposed between the second oxide semiconductor pattern and the first-second metal pattern.

20 Claims, 19 Drawing Sheets

(56) References Cited

U.S. PATENT DOCUMENTS

| | | |
|---|---|---|
| 11,744,111 B2 | 8/2023 | Maruyama |
| 2010/0159639 A1 | 6/2010 | Sakata |
| 2012/0146036 A1 | 6/2012 | Minami et al. |
| 2014/0306225 A1 | 10/2014 | Kikuchi et al. |
| 2016/0093742 A1 | 3/2016 | Momose et al. |
| 2016/0210925 A1* | 7/2016 | Chung .................. G11C 19/28 |
| 2017/0278916 A1* | 9/2017 | Maruyama .......... H01L 27/1255 |
| 2018/0122886 A1 | 5/2018 | Kim et al. |
| 2018/0166015 A1* | 6/2018 | Beak .................. H10K 59/1216 |
| 2018/0204896 A1* | 7/2018 | Park .................... H10K 59/131 |
| 2019/0027511 A1 | 1/2019 | Li et al. |
| 2019/0067409 A1 | 2/2019 | Shin et al. |
| 2019/0214447 A1 | 7/2019 | Kim et al. |
| 2020/0074937 A1 | 3/2020 | Choi |
| 2020/0118509 A1 | 4/2020 | Noh et al. |
| 2020/0373374 A1 | 11/2020 | Park |
| 2021/0005693 A1 | 1/2021 | Cho et al. |
| 2021/0056898 A1 | 2/2021 | Park et al. |
| 2021/0193049 A1 | 6/2021 | Lin et al. |
| 2022/0085341 A1* | 3/2022 | Kim ....................... H10K 59/12 |
| 2022/0173198 A1* | 6/2022 | Kim .................... H10K 59/131 |

\* cited by examiner

DISPLAY PANEL AND ELECTRONIC DEVICE INCLUDING SAME

CROSS-REFERENCE TO RELATED APPLICATION

This application claims priority to and the benefit of Korean Patent Application No. 10-2021-0117694, filed on Sep. 3, 2021, Korean Patent Application No. 10-2021-0188351, filed on Dec. 27, 2021, and Korean Patent Application No. 10-2022-0088215, filed on Jul. 18, 2022, the disclosure of which is incorporated herein by reference in its entirety.

BACKGROUND

Technical Field

The present disclosure relates to a display panel and an electronic device including the same.

Description of the Related Art

An electroluminescence display device may be divided into an inorganic light emitting display device and an organic light emitting display device according to the material of the emission layer. The active matrix type organic light emitting display device includes an organic light emitting diode (hereinafter, referred to as "OLED") that emits light by itself, and has the advantage of fast response speed, high light-emitting efficiency, high luminance and wide viewing angle. In the organic light emitting display device, the OLED (Organic Light Emitting Diode) is formed in each pixel. The organic light emitting display device has a fast response speed, excellent light-emitting efficiency, luminance, and viewing angle, and has also excellent contrast ratio and color reproducibility because black gray scale can be expressed as complete black.

The organic light emitting display device is used to reproduce video contents or visually display information in various electronic devices such as a television (TV) system, a tablet computer, a laptop computer, a navigation system, and a vehicle system as well as small/portable terminals such as a wearable device and a smart phone.

A display panel of the organic light emitting display device includes a pixel circuit, and many transistors constituting a driving circuit for driving the pixel circuit.

BRIEF SUMMARY

Typically in the related art, in order to reduce the number of manufacturing processes of the display panel, the transistors formed in the display panel are generally manufactured to have the same structure. As a result, the transistors formed in the display panel may cause unnecessary power consumption and may unnecessarily increase in size.

One or more embodiments of the present disclosure are provided to solve one or more problems in the related art including the above-mentioned problems.

The present disclosure provides a display panel and an electronic device including the same, capable of improving power consumption, reducing a bezel area of the display panel, and improving image quality by optimizing a sub-threshold slope factor (S-factor) of transistors depending on their use.

The problems of the present disclosure are not limited to those mentioned above, and other problems not mentioned will be clearly understood by those skilled in the art from the following description.

A display panel according to an embodiment of the present disclosure may include: a circuit layer disposed on a substrate and including a plurality of transistors; a light emitting element layer disposed on the circuit layer and including a plurality of light emitting elements; and an encapsulation layer configured to cover the light emitting element layer.

All transistors in the circuit layer may be n-channel oxide transistors.

The circuit layer may include at least a first transistor and a second transistor.

The first transistor may include a first oxide semiconductor pattern, a gate electrode overlapping the first oxide semiconductor pattern above the first oxide semiconductor pattern, a first electrode in contact with one side of the first oxide semiconductor pattern on the first oxide semiconductor pattern, a second electrode in contact with the other side of the first oxide semiconductor pattern on the first oxide semiconductor pattern, and a first-first metal pattern disposed on the substrate to overlap the first oxide semiconductor pattern.

The second transistor may include a second oxide semiconductor pattern, a gate electrode overlapping the second oxide semiconductor pattern above the second oxide semiconductor pattern, a first electrode in contact with one side of the second oxide semiconductor pattern on the second oxide semiconductor pattern, a second electrode in contact with the other side of the second oxide semiconductor pattern on the second oxide semiconductor pattern, a first-second metal pattern disposed on the substrate to overlap the second oxide semiconductor pattern, and a second metal pattern disposed between the second oxide semiconductor pattern and the first-second metal pattern.

In the display panel according to another embodiment of the present disclosure, the first transistor may include a first oxide semiconductor pattern, a gate electrode overlapping the first oxide semiconductor pattern above the first oxide semiconductor pattern, a first electrode in contact with one side of the first oxide semiconductor pattern on the first oxide semiconductor pattern, and a second electrode in contact with the other side of the first oxide semiconductor pattern on the first oxide semiconductor pattern.

The second transistor may include a second oxide semiconductor pattern, a gate electrode overlapping the second oxide semiconductor pattern above the second oxide semiconductor pattern, a first electrode in contact with one side of the second oxide semiconductor pattern on the second oxide semiconductor pattern, a second electrode in contact with the other side of the second oxide semiconductor pattern on the second oxide semiconductor pattern, a first metal pattern disposed on the substrate to overlap the second oxide semiconductor pattern, and a second metal pattern disposed between the second oxide semiconductor pattern and the first metal pattern.

A display panel according to further another embodiment of the present disclosure includes: a circuit layer disposed on a substrate and including a plurality of transistors; a light emitting element layer disposed on the circuit layer and including a plurality of light emitting elements; and an encapsulation layer configured to cover the light emitting element layer.

All transistors in the circuit layer is n-channel oxide transistors.

The circuit layer includes a gate driver including a shift register.

Signal transmitters in the shift register each includes: a transistor having a source contact structure, the transistor including a gate electrode, a first oxide semiconductor pattern, a first electrode in contact with one side of the first oxide semiconductor pattern, a second electrode in contact with the other side of the first oxide semiconductor pattern, and a metal pattern disposed under the first oxide semiconductor pattern and in contact with the second electrode; a transistor having a back gate, the transistor including a gate electrode, a second oxide semiconductor pattern, a first electrode in contact with one side of the second oxide semiconductor pattern, a second electrode in contact with the other side of the second oxide semiconductor pattern, and a metal pattern disposed under the second oxide semiconductor pattern and to which a constant voltage is applied; and a transistor having a double gate, the transistor including a gate electrode, a third oxide semiconductor pattern, a first electrode in contact with one side of the third oxide semiconductor pattern, a second electrode in contact with the other side of the third oxide semiconductor pattern, and a metal pattern disposed under the third oxide semiconductor pattern and in contact with the gate electrode.

An electronic device according to an embodiment of the present disclosure may include the display panel.

In the display panel of the present disclosure, all transistors are implemented with n-channel oxide thin film transistors (TFTs). The n-channel oxide TFTs have a subthreshold slope factor (S-factor) characteristic optimized for the purpose of the transistors by using two metal layers and an insulating layer disposed thereunder. As a result, in the present disclosure, power consumption of the display panel may be reduced, the bezel area of the display panel may be reduced, and image quality may be improved by improving low grayscale unevenness.

In the display panel of the present disclosure, VSS lines through which a pixel reference voltage EVSS is applied may be removed from the bezel area where a gate driver is disposed, and may be arranged within a pixel array, thereby further reducing the bezel area of the display panel. In addition, in the present disclosure, by reducing the resistance of the VSS lines, it is possible to prevent the luminance fluctuation of pixels due to the rising of the pixel reference voltage applied to the VSS lines.

Effects of the present disclosure are not limited to those mentioned above, and other effects not mentioned will be clearly understood by those skilled in the art from the description of the claims.

BRIEF DESCRIPTION OF THE SEVERAL VIEWS OF THE DRAWINGS

The above and other objects, features, and advantages of the present disclosure will become more apparent to those of ordinary skill in the art by describing example embodiments thereof in detail with reference to the attached drawings, in which.

DETAILED DESCRIPTION

Figure 1:
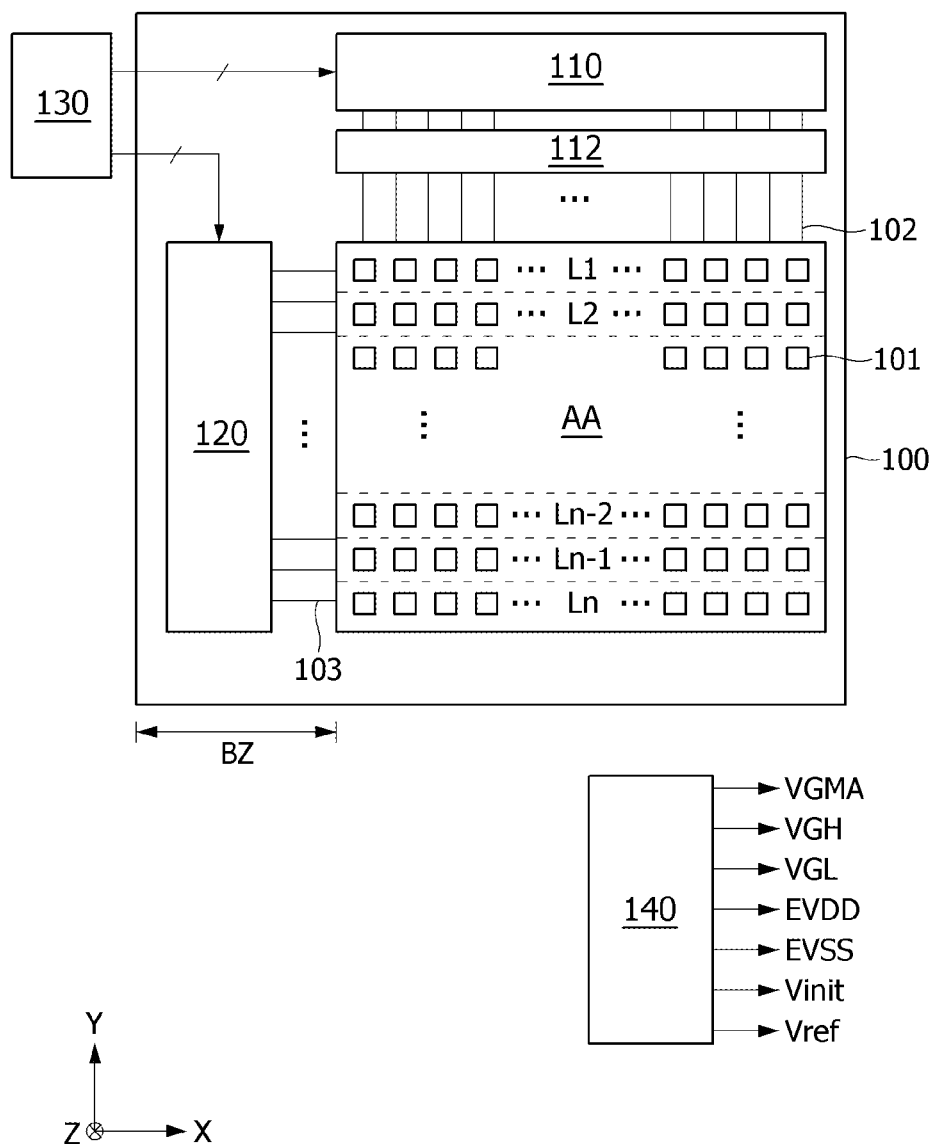
FIG. 1 is a block diagram illustrating a display device according to an embodiment of the present disclosure.

Advantages and features of the present disclosure, and a method of achieving them will become apparent with reference to the embodiments described below in detail together with the accompanying drawings. The present disclosure is not limited to the embodiments disclosed below, but will be implemented in a variety of different forms. However, the embodiments of the present disclosure are provided to complete the present disclosure, and to fully inform the scope of the disclosure to those of ordinary skill in the art to which the present disclosure pertains.

The shapes, sizes, dimensions (e.g., length, width, height, thickness, radius, diameter, area, etc.), ratios, angles, number of elements, and the like disclosed in the drawings for explaining the embodiments of the present disclosure are example, and thus the present disclosure is not limited to the illustrated matters.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

The same reference numerals used herein refer to the same components. In addition, in describing the present disclosure, when it is determined that a detailed description of a related known technique may unnecessarily obscure the subject matter of the present disclosure, the detailed description thereof will be omitted.

When terms such as "include," "comprise," "have," and "consist of" are used herein, other parts may be added unless "only" is used. In the case of expressing the components in the singular, it includes the case of including the plural unless specifically stated otherwise.

In interpreting the components, it is interpreted as including an error range even if there is no explicit description.

In describing the positional relationship, for example, if the positional relationship of two parts is described as terms such as "on ~," "above ~," "below ~," and "beside ~," one or more other parts may be located between the two parts unless "right," or "directly" is used.

First, second, etc., may be used to classify the components, but the functions or structures of these components are not limited by the ordinal number or the name of the component before the component.

The following embodiments may be partially or totally combined or combined with each other, and technically various interlocking and driving are possible. Each of the embodiments may be implemented independently of each other, or may be implemented together in an association relationship.

Each of the pixels is divided into a plurality of sub-pixels having different colors for color implementation, and each of the sub-pixels includes a transistor used as a switch element or a driving element. Such a transistor may be implemented as a thin film transistor (TFT).

The driving circuit of the display device writes the pixel data of the input image to the pixels. A driving circuit of a flat panel display device includes a data driver supplying a data signal to data lines, a gate driver supplying a gate signal to gate lines, and the like.

The display panel of the present disclosure may include a plurality of transistors. A transistor is basically a three-terminal element including a gate, a source, and a drain. The source is an electrode through which carriers are supplied to the transistor. The transistor of the present disclosure may be implemented with a four-terminal element to which a back gate bias is applied in order to shift a threshold voltage to a desired voltage. In the transistor, carriers begin to flow from the source. The drain is an electrode through which carriers exit the transistor. In the transistor, carriers flow from the source to the drain. In the case of an n-channel transistor, since carriers are electrons, a source voltage is lower than a drain voltage so that electrons can flow from the source to the drain. In the n-channel transistor, a current flows from the drain to the source. In the case of a p-channel transistor, since carriers are holes, a source voltage is higher than a drain voltage so that holes can flow from the source to the drain. In the p-channel transistor, since holes flow from the source to the drain, a current flows from the source to the drain. It should be noted that the source and drain of the transistor are not fixed. For example, the source and the drain may be changed according to an applied voltage. Accordingly, the present disclosure is not limited by the source and drain of the transistor. In the following description, the source and drain of the transistor will be referred to as first and second electrodes.

The gate pulse may swing between a gate on voltage and a gate off voltage. The gate-on voltage is set higher than the threshold voltage of the transistor. The gate-off voltage is set lower than the threshold voltage of the transistor.

The transistor is turned on in response to the gate-on voltage, and turned off in response to the gate-off voltage. In the case of the n-channel transistor, the gate-on voltage may be a gate high voltage VGH, and the gate-off voltage may be a gate low voltage VGL.

Hereinafter, various embodiments of the present disclosure will be described in detail with reference to the accompanying drawings. In the following embodiments, the display device will be mainly described as an organic light emitting display device, but the present disclosure is not limited thereto.

An electronic device of the present disclosure includes a display device including a display panel on which an input image is reproduced, and a host system that transmits pixel data of the input image to the display device.

Figure 2:
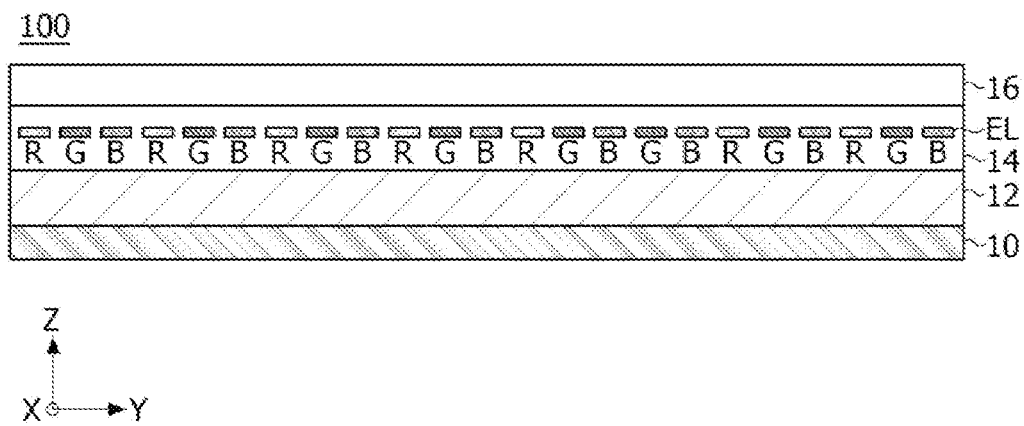
FIG. 2 is a cross-sectional view illustrating a cross-sectional structure of a display panel shown in FIG. 1.

Referring to FIGS. 1 and 2, the display device according to an embodiment of the present disclosure includes a display panel 100, a display panel driver for writing pixel data into pixels of the display panel 100, and a power supply 140 for generating power required to drive the pixels and the display panel driver.

The display panel 100 may have a rectangular structure having a length in an X-axis direction, a width in a Y-axis direction, and a thickness in a Z-axis direction. The display panel 100 includes a pixel array AA that displays an input image on a screen. The pixel array AA includes a plurality of data lines 102, a plurality of gate lines 103 intersecting the data lines 102, and pixels 101 arranged in a matrix form. The display panel 100 may further include power lines commonly connected to the pixels. The power lines supply a constant voltage for driving the pixels 101 to the pixels 101. For example, the display panel 100 may include a VDD line through which a pixel driving voltage EVDD is applied, and a VSS line through which a pixel reference voltage EVSS is applied. In addition, the power lines may further include an REF line through which a reference voltage Vref is applied, and an INIT line through which an initialization voltage Vinit is applied.

As shown in FIG. 2, the cross-sectional structure of the display panel 100 may include a circuit layer 12, a light emitting element layer 14, and an encapsulation layer 16 stacked on a substrate 10.

The circuit layer 12 may include a TFT array including a pixel circuit connected to wires such as the data line, the gate line, and the power line, a demultiplexer array 112, a gate driver 120, and the like. The wires and circuit elements of the circuit layer 12 may include a plurality of insulating layers, two or more metal layers separated with the insulating layer therebetween, and an active layer including a semiconductor material. All transistors formed in the circuit layer 12 may be implemented with n-channel oxide TFTs having a coplanar structure. However, the embodiments of the present disclosure are not limited thereto. For example, one or more transistors formed in the circuit layer 12 may be implemented with p-channel TFTs.

The light emitting element layer 14 may include a light emitting element EL driven by the pixel circuit. The light emitting element EL may include a red (R) light emitting element, a green (G) light emitting element, and a blue (B) light emitting element. In another embodiment, the light emitting element layer 14 may include a white light emitting element and a color filter. The light emitting elements EL of the light emitting element layer 14 may be covered with a protective layer including an organic film and a passivation film.

The encapsulation layer 16 covers the light emitting element layer 14 to seal the circuit layer 12 and the light emitting element layer 14. The encapsulation layer 16 may have a multi-insulating film structure in which an organic film and an inorganic film are alternately stacked. The inorganic film blocks the penetration of moisture and oxygen. The organic film planarizes the surface of the inorganic film. When the organic film and the inorganic film are stacked in multiple layers, the movement path of moisture or oxygen becomes longer than that in a single layer, so that the penetration of moisture and oxygen affecting the light emitting element layer 14 may be effectively blocked.

A touch sensor layer, which is omitted from the drawing, may be formed on the encapsulation layer 16, and a polarizing plate or a color filter layer may be disposed thereon. The touch sensor layer may include capacitive touch sensors that sense a touch input based on a change in capacitance before and after the touch input. The touch sensor layer may include insulating films and metal wiring patterns that form the capacitance of the touch sensors. The insulating films may insulate intersecting portions in the metal wiring patterns and may planarize the surface of the touch sensor layer. The polarizing plate may improve visibility and contrast ratio by converting the polarization of external light reflected by the metal of the circuit layer and the touch sensor layer. The polarizing plate may be implemented as a circular polarizing plate or a polarizing plate in which a linear polarizing plate and a phase retardation film are bonded. A cover glass may be bonded to the polarizing plate. The color filter layer may include red, green, and blue color filters. The color filter layer may further include a black matrix pattern. The color filter layer may absorb a part of the wavelength of light reflected from the circuit layer and the touch sensor layer to replace the polarizing plate and increase the color purity of an image reproduced in the pixel array AA.

The pixel array AA includes a plurality of pixel lines L1 to Ln. Each of the pixel lines L1 to Ln includes one line of pixels arranged along a line direction (X-axis direction) in the pixel array AA of the display panel 100. The pixels arranged in one pixel line share the gate lines 103. Sub-pixels arranged in a column direction Y along a data line direction share the same data line 102. One horizontal period is a time period obtained by dividing one frame period by the total number of the pixel lines L1 to Ln.

The display panel 100 may be implemented as a non-transmissive display panel or a transmissive display panel. The transmissive display panel may be applied to a transparent display device in which an image is displayed on a screen and an actual background is visible. The display panel 100 may be manufactured as a flexible display panel.

Each of the pixels 101 may be divided into a red sub-pixel, a green sub-pixel, and a blue sub-pixel to implement color. Each of the pixels may further include a white sub-pixel. Each of the sub-pixels includes the pixel circuit. Hereinafter, a pixel may be interpreted as having the same meaning as a sub-pixel. The pixel circuits are connected to the data lines, the gate lines, and the power lines. The pixel circuits may be implemented as a circuit shown in FIG. 5, but is not limited thereto.

The pixels may be arranged as real color pixels and pentile pixels. The pentile pixel may realize a higher resolution than that of a real color pixel by driving two sub-pixels having different colors as one pixel 101 by using a preset pixel rendering algorithm. The pixel rendering algorithm may compensate for insufficient color representation in each pixel with the color of light emitted from an adjacent pixel.

The power supply 140 generates a DC voltage (or constant voltage) for driving the pixel array AA of the display panel 100 and the display panel driver by using a DC-DC converter. The DC-DC converter may include a charge pump, a regulator, a buck converter, a boost converter, and the like. The power supply 140 may adjust the level of a DC input voltage applied from a host system (not shown) to generate DC voltages (or constant voltages) such as a gamma reference voltage VGMA, the gate-on voltage VGH, the gate-off voltage VGL, the pixel driving voltage EVDD, the pixel reference voltage EVSS, the initialization voltage Vinit, and the reference voltage Vref. The gamma reference voltage VGMA is supplied to a data driver 110. The gate-on voltage VGH and the gate-off voltage VGL are supplied to the gate driver 120. The constant voltages such as the pixel driving voltage EVDD, the pixel reference voltage EVSS, the initialization voltage Vinit, and the reference voltage Vref are supplied to the pixels 101 through the power lines commonly connected to the pixels 101. The constant voltages applied to the pixel circuit may have different voltage levels.

The display panel driver writes the pixel data of the input image to the pixels of the display panel 100 under the control of a timing controller 130.

The display panel driver includes the data driver 110 and the gate driver 120. The display panel driver may further include a demultiplexer array 112 disposed between the data driver 110 and the data lines 102.

The demultiplexer array 112 sequentially supplies the data voltages outputted from the channels of the data driver 110 to the data lines 102 using a plurality of demultiplexers DEMUX. The demultiplexer may include a plurality of switch elements disposed on the display panel 100.

When the demultiplexer is disposed between the data lines 102 and the output terminals of the data driver 110, the number of channels of the data driver 110 may be reduced. The demultiplexer array 112 may be omitted.

The display panel driver may further include a touch sensor driver for driving the touch sensors. The touch sensor driver is omitted from FIG. 1. The data driver 110 or, the data driver 110 and the touch sensor driver may be integrated into one drive integrated circuit (IC) DIC shown in FIG. 3. In a mobile device or a wearable device, the timing controller 130, the power supply 140, the data driver 110, and the like may be integrated into one drive IC.

The display panel driver may operate in a low speed driving mode under the control of the timing controller 130. The low speed driving mode may be set to reduce power consumption of the display device when the input image does not change by a preset number of frames as a result of analyzing the input image. In the low speed driving mode, power consumption of the display panel driver and the display panel 100 may be reduced by lowering a refresh rate of pixels when a still image is inputted for a predetermined time or over. The low speed driving mode is not limited to when a still image is inputted. For example, when the display device operates in a standby mode or when a user command or an input image is not inputted to the display panel driver for a predetermined time or over, the display panel driver may operate in the low speed driving mode.

The data driver 110 receives the pixel data, which is a digital signal, of the input image from the timing controller 130 and outputs a data voltage. The data driver 110 converts the pixel data of the input image into a gamma compensation voltage every frame period using a digital to analog converter (DAC) to generate a data voltage Vdata. The gamma reference voltage VGMA is divided into a gamma compensation voltage for each grayscale through a voltage divider circuit. The gamma compensation voltage for each grayscale is provided to the DAC of the data driver 110. The data voltage Vdata is outputted from each of the channels of the data driver 110 through an output buffer.

The gate driver 120 may be implemented as a gate in panel (GIP) circuit formed in a circuit layer 12 on the display panel 100 together with wires and the TFT array of the pixel array AA. The gate driver 120 may be disposed in a bezel area BZ, which is the non-display area of the display panel 100, or may be distributedly disposed in the pixel array AA where the input image is reproduced. The gate driver 120 sequentially outputs the gate signal to the gate lines 103 under the control of the timing controller 130. The gate driver 120 may shift the gate signal by using a shift register to sequentially supply the signals to the gate lines 103. The gate signal may include various gate pulses such as a scan pulse, an emission control pulse (hereinafter, referred to as an "EM pulse"), an initialization pulse, and a sensing pulse.

The gate driver 120 may be disposed in the bezel area BZ on one side of the display panel 100 to supply the gate pulse to the gate lines 103 in a single feeding method. In addition, the gate driver 120 may be disposed in the bezel areas BZ on both sides of the display panel 100 with the pixel array AA interposed therebetween and may supply the gate pulse to the gate lines 103 in a double feeding method.

The timing controller 130 receives digital video data DATA of the input image and a timing signal synchronized with the digital video data DATA from the host system. The timing signal may include a vertical synchronization signal Vsync, a horizontal synchronization signal Hsync, a clock CLK, a data enable signal, and the like. Since a vertical period and a horizontal period can be known by counting the data enable signal, the vertical synchronization signal Vsync and the horizontal synchronization signal Hsync may be omitted. The data enable signal has a cycle of one horizontal period 1H.

The host system may be any one of a television (TV) system, a tablet computer, a laptop computer, a navigation system, a personal computer (PC), a home theater system, a mobile device, a wearable device, and a vehicle system. The host system may scale an image signal from a video source to fit the resolution of the display panel 100 and transmit it to the timing controller 130 together with the timing signal.

In a normal driving mode, the timing controller 130 may multiply an input frame frequency by i (i being a natural number) times to control the operation timing of the display panel driver with a frame frequency of the input frame frequency×i Hz. The input frame frequency is 60 Hz in a national television standards committee (NTSC) method and 50 Hz in a phase-alternating line (PAL) method.

The timing controller 130 lowers the frequency of the frame rate at which pixel data is written to pixels in the low speed driving mode than in the normal driving mode. For example, a data refresh frame frequency at which pixel data is written to pixels in the normal driving mode may be generated at a frequency of 60 Hz or higher, e.g., a refresh rate of any one of 60 Hz, 120 Hz, and 144 Hz, and a data refresh frame DRF in the low speed driving mode may be generated at a refresh rate of a lower frequency than that in the normal driving mode.

Based on the timing signal Vsync, Hsync, and DE received from the host system, the timing controller 130 generates a data timing control signal for controlling the operation timing of the data driver 110, a control signal for controlling the operation timing of the demultiplexer array 112, and a gate timing control signal for controlling the operation timing of the gate driver 120. The timing controller 130 controls the operation timing of the display panel driver to synchronize the data driver 110, the demultiplexer array 112, the touch sensor driver, and the gate driver 120.

The gate timing control signal generated from the timing controller 130 may be inputted to the shift register of the gate driver 120 through a level shifter (not shown). The level shifter may receive the gate timing control signal to generate a start pulse and a shift clock, and provide them to the shift register of the gate driver 120.

Figure 3:
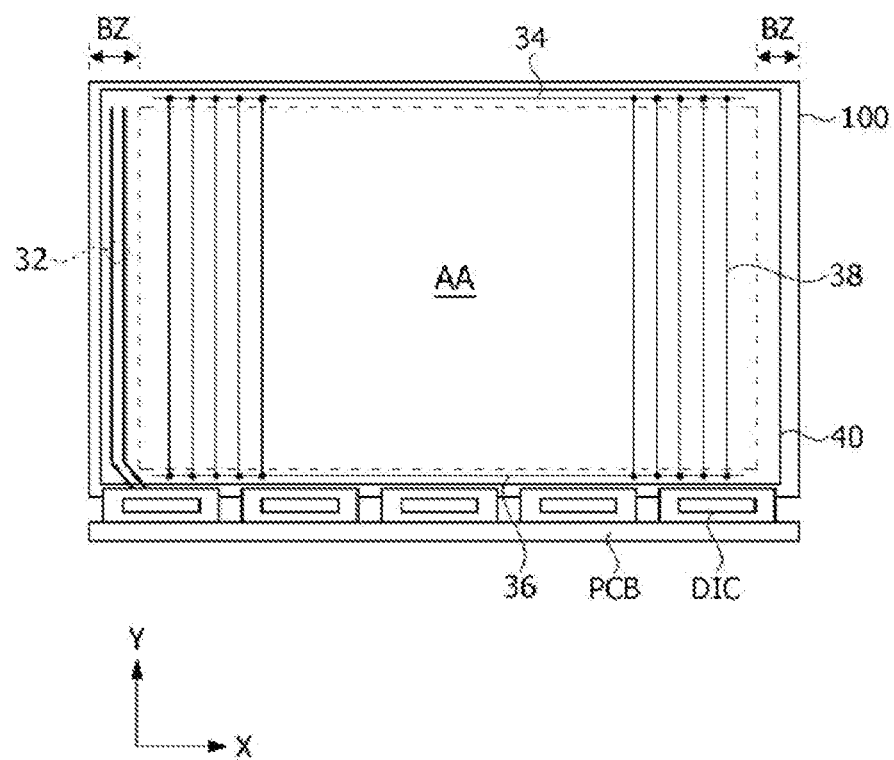
FIG. 3 is a plan view illustrating an example in which a plurality of drive ICs are attached to a display panel.
Figure 4:
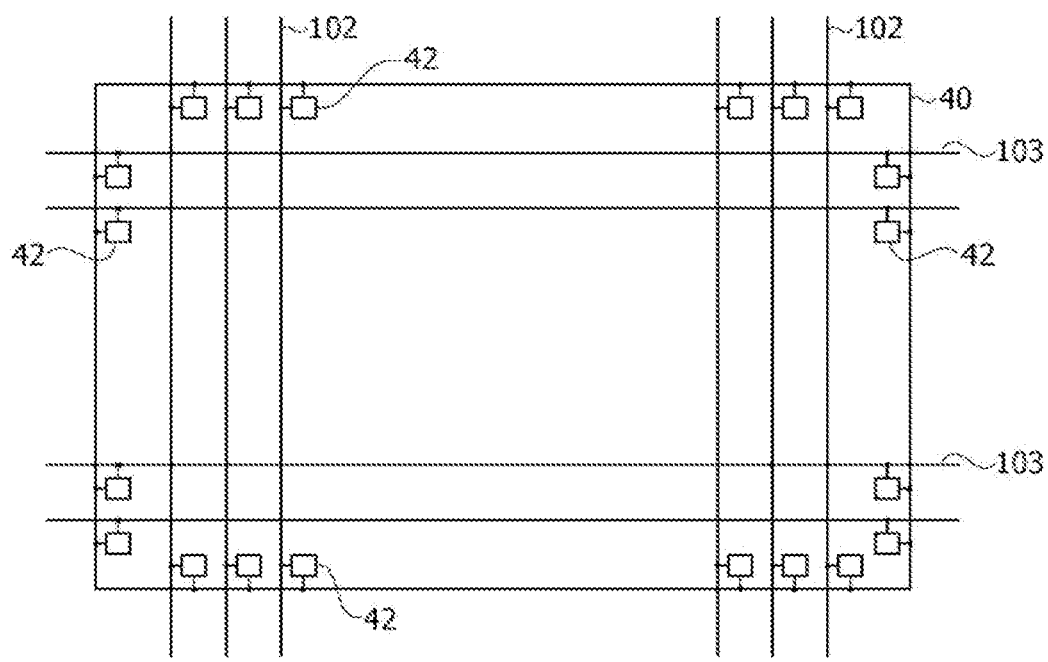
FIG. 4 is a diagram schematically illustrating an example of electrostatic discharge (ESD) wire and ESD elements.

FIG. 3 is a plan view illustrating an example in which a plurality of drive ICs DIC are attached to the display panel 100. FIG. 4 is a diagram schematically illustrating an example of an electrostatic discharge (ESD) wires and ESD elements.

Referring to FIGS. 3 and 4, each of the drive ICs DIC may include the data driver 110, or the data driver 110 and the touch sensor driver. Each of the drive ICs DIC is mounted on a film substrate of a chip on film (COF), and the COF may be bonded to the substrate of the display panel 100 as an anisotropic conductive film (ACF). The input terminals of the COFs are connected to a printed circuit board PCB. At least one of the COFs includes an output terminal electrically connected to the data lines on the display panel 100 and an output terminal electrically connected to touch sensor wires on the display panel 100.

At least one of the COFs includes dummy wires through which the start pulse, the shift clock, the gate voltages VGH and VGL for driving the gate driver 120 are applied. The dummy wires are connected to GIP wires 32 on the display panel through the output terminal of the COF to be electrically connected to the gate driver 120. The GIP wires 32 include clock wires through which the start pulse and the shift clock are applied, and power wires through which the gate voltages VGH and VGL are applied.

The power wires, e.g., the VDD line, the VSS line, the REF line, the INIT line, and the like, commonly connected to the pixels are connected to the pixels in the pixel array AA. VSS lines (or EVSS auxiliary wires) 38 through which the pixel reference voltage EVSS is applied are connected, as shown in FIG. 3, to VSS shorting bars 34 and 36 formed at the upper and lower ends of the display panel 100.

The VSS lines 38 may be formed with wires in a long stripe shape along a direction Y parallel to the data lines 102. The VSS shorting bars 34 and 36 that commonly connect the VSS lines 38 may be formed with long stripe-shaped wires along a direction X parallel to the gate lines 103 at the upper and lower ends of the display panel 100.

Since the VSS lines 38 are not disposed in the left and right bezel areas BZ of the display panel 100 in which the gate driver 120 is disposed, the left and right bezel areas BZ of the display panel 100 are reduced. In the case of a pixel circuit implemented with an n-channel oxide TFT, the rising of the pixel reference voltage EVSS due to IR drop of the VSS line has a great influence on the luminance of the pixels. Accordingly, it is beneficial that the combined resistance of the VSS lines 38 be designed to be as small as possible, for example, 4 Ω or less.

The display panel 100 further includes an electrostatic discharge (ESD) wire 40 formed in a closed loop shape in the bezel area outside the pixel array AA. A ground voltage GND or the pixel reference voltage EVSS is applied to the ESD wire 40. A plurality of ESD elements 42 are connected to the ESD wire 40 as shown in FIG. 4. Each of the ESD elements 42 includes one or more n-channel oxide TFTs and operates as a diode. The ESD elements 42 include ESD elements 42 connected between the data lines 102 and the ESD wire 40, and ESD elements 42 connected between the gate lines 103 and the ESD wire 40. When static electricity is applied to the pixel array AA, the ESD elements are turned on to discharge the static electricity to the ESD wire 40, thereby protecting the pixel array AA from the static electricity.

Due to process deviations and element characteristic deviations caused in the manufacturing process of the display panel 100, there may be differences in electrical characteristics of driving elements between pixels, and such differences may increase as driving time of the pixels elapses. In order to compensate for deviations in electrical characteristics of the driving elements between pixels, an internal compensation circuit may be built into the pixel circuit or an external compensation circuit may be connected to the pixel circuit. The internal compensation circuit implemented in each pixel circuit is used to sample the electrical characteristics of the driving element for each sub-pixel and compensate for the gate-source voltage Vgs of the driving element by the electrical characteristics of the driving element. The external compensation circuit connected to the pixel circuit is used to generate a compensation value based on a result of sensing the electrical characteristics of the driving element and compensate for changes in the electrical characteristics of the driving element.

The external compensation circuit includes an REF line (or sensing line) RL connected to the pixel circuit, and an analog to digital converter (ADC) that converts a sensing voltage stored in the REF line RL into digital data. The sensing voltage may include the electrical characteristics, e.g., a threshold voltage and/or mobility of the driving element. An integrator may be connected to the input terminal of the ADC. The timing controller 130 to which the external compensation circuit is applied generates a compensation value for compensating for changes in the electrical characteristics of the driving element according to sensing data inputted from the ADC, and adds or multiplies the compensation value to or by the pixel data of the input image to compensate for changes in the electrical characteristics of the driving element. The ADC may be embedded in the data driver 110.

Figure 5:
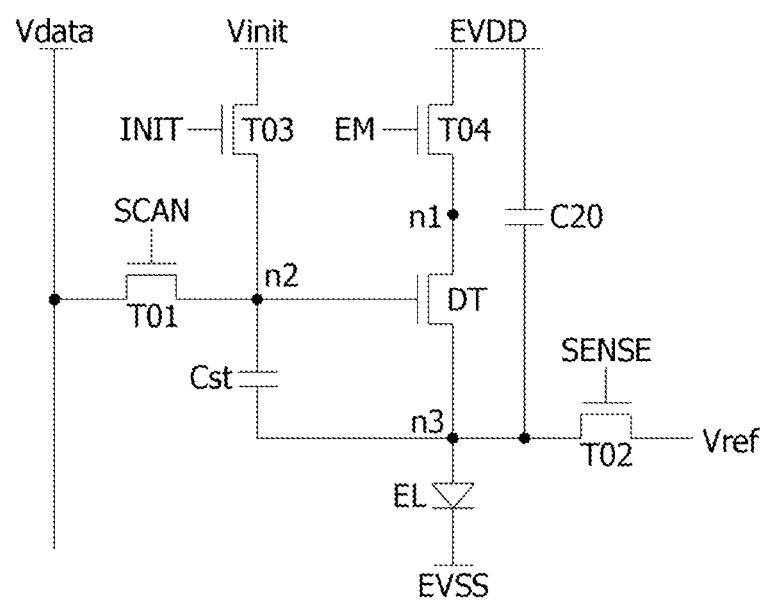
FIG. 5 is a circuit diagram illustrating a pixel circuit applicable to a display panel of the present disclosure.

FIG. 5 is a circuit diagram illustrating an example of a pixel circuit applicable to a display panel of the present disclosure. It should be noted that the pixel circuit of the present disclosure is not limited to that shown in FIG. 5.

Referring to FIG. 5, the pixel circuit includes the light emitting element EL, a driving element DT for supplying a current to the light emitting element EL, a plurality of switch elements T01 to T04 turned on/off in response to the voltages of gate signals SCAN, SENSE, INIT, and EM, and a capacitor Cst. In this pixel circuit, the driving element DT and the switch elements T01 to T04 may be implemented with n-channel oxide TFTs.

The gate signal includes a scan pulse SCAN, a sensing pulse SENSE, an initialization pulse INIT, and an EM pulse EM. The gate driver 120 includes a first shift register sequentially outputting the scan pulse SCAN, a second shift register sequentially outputting the sensing pulse SENSE, a third shift register sequentially outputting the initialization pulse INIT, and a fourth shift register sequentially outputting the EM pulses EM.

Constant voltages such as the pixel driving voltage EVDD, the pixel reference voltage EVSS, the reference voltage Vref, and the initialization voltage Vinit are applied to the pixel circuit. The pixel driving voltage EVDD is higher than the pixel reference voltage EVSS. The initialization voltage Vinit may be set within a data voltage range. The reference voltage Vref may be set to a low voltage similar to the pixel reference voltage EVSS. A capacitor C20 may be connected between the VDD line and the third node n3.

The light emitting element EL may be implemented with an OLED. The OLED includes an organic compound layer formed between an anode electrode and a cathode electrode. The organic compound layer may include a hole injection layer (HIL), a hole transport layer (HTL), an emission layer (EML), an electron transport layer (ETL), and an electron injection layer (EIL), but is not limited thereto. The anode electrode of the light emitting element EL is connected to a third node n3, and the cathode electrode thereof is connected to a VSS node to which the pixel reference voltage EVSS is applied. The VSS node is connected to the VSS line. The light emitting element EL includes a capacitor formed between an anode electrode and a cathode electrode. The capacitor of the light emitting element EL is omitted from the drawing. The OLED used as the light emitting element EL may have a tandem structure in which a plurality of emission layers are stacked. The OLED having a tandem structure may improve the luminance and lifespan of the pixel.

When a voltage is applied to the anode and cathode electrodes of the light emitting element EL, holes passing through the hole transport layer (HTL) and electrons passing through the electron transport layer (ETL) move to the emission layer (EML) to form excitons. In this case, visible light may be emitted from the emission layer (EML).

The driving element DT includes a gate electrode connected to a second node n2, a first electrode connected to a first node n1, and a second electrode connected to the third node n3. The capacitor Cst is connected between the second node n2 and the third node n3 to store the gate-source voltage Vgs of the driving element DT. The driving element DT may be implemented with a four-terminal element further including a second gate electrode (or bottom gate electrode) for applying a back gate bias.

A first switch element T01 is turned on in response to the gate-on voltage VGH of the scan pulse SCAN to supply the data voltage Vdata of the pixel data to the second node n2. The first switch element T01 includes a gate electrode connected to a first gate line through which the scan pulse SCAN is applied, a first electrode connected to the data line through which the data voltage Vdata is applied, and a second electrode connected to the second node n2.

The second switch element T02 is turned on in response to the gate-on voltage VGH of the sensing pulse SENSE to supply the reference voltage Vref to the third node n3. The second switch element T02 includes a gate electrode connected to a second gate line through which the sensing pulse SENSE is applied, a first electrode connected to the REF line through which the reference voltage Vref is applied, and a second electrode connected to the third node n3.

The third switch element T03 is turned on in response to the gate-on voltage VGH of the initialization pulse INIT to apply the initialization voltage Vinit to the second node n2. The third switch element T03 includes a gate electrode connected to a third gate line through which the initialization pulse INIT is applied, a first electrode connected to the INIT line through which the initialization voltage Vinit is applied, and a second electrode connected to the second node n2.

The fourth switch element T04 is turned on in response to the gate-on voltage VGH of the EM pulse EM to supply the pixel driving voltage EVDD to the first node n1. The fourth switch element T04 includes a gate electrode connected to a fourth gate line through which the EM pulse EM is applied, a first electrode connected to the VDD line through which the pixel driving voltage EVDD is applied, and a second electrode connected to the first node n1.

Figure 6A:
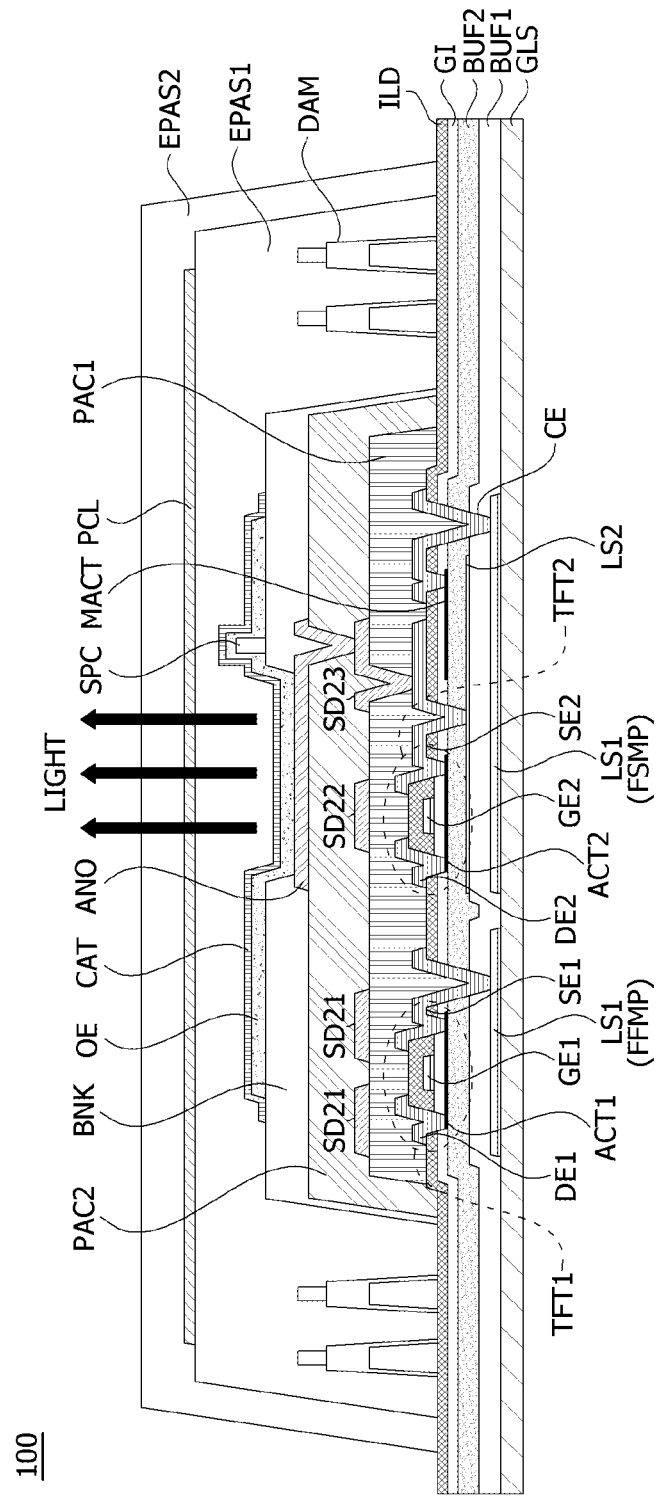
FIGS. 6A and 6B are cross-sectional views illustrating a cross-sectional structure of a display panel according to an embodiment of the present disclosure.
Figure 6B:
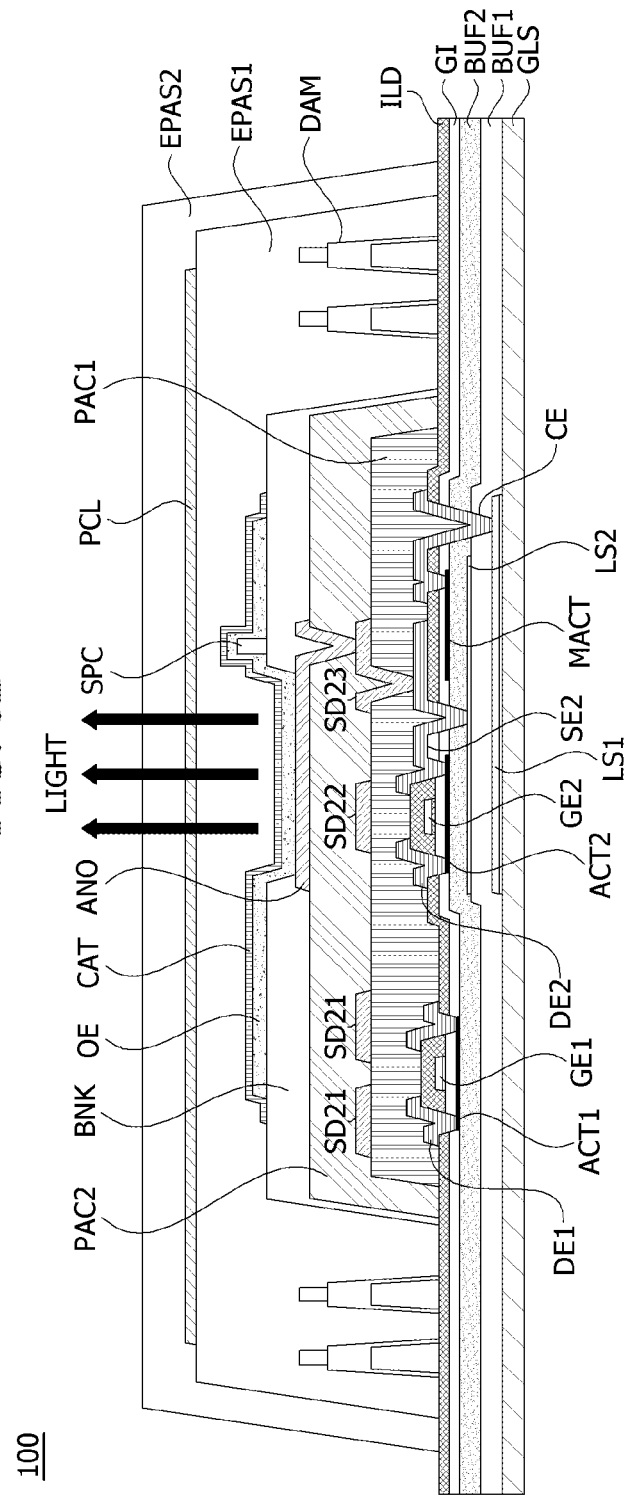
Figure 7A:
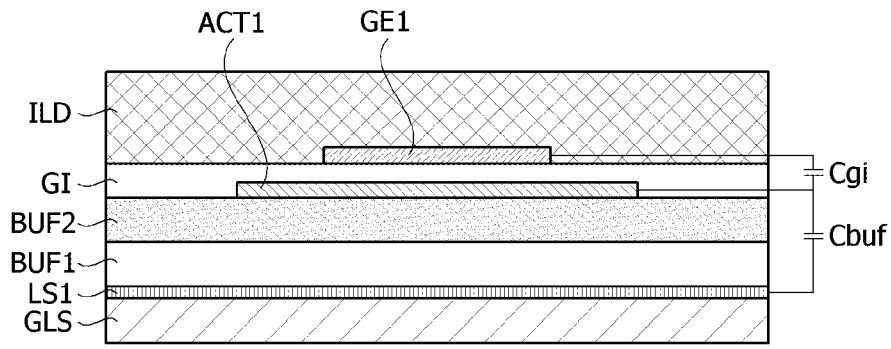
FIG. 7A is an enlarged cross-sectional view of a lower structure of a first TFT in FIG. 6A while omitting the first and second electrodes.
Figure 7B:
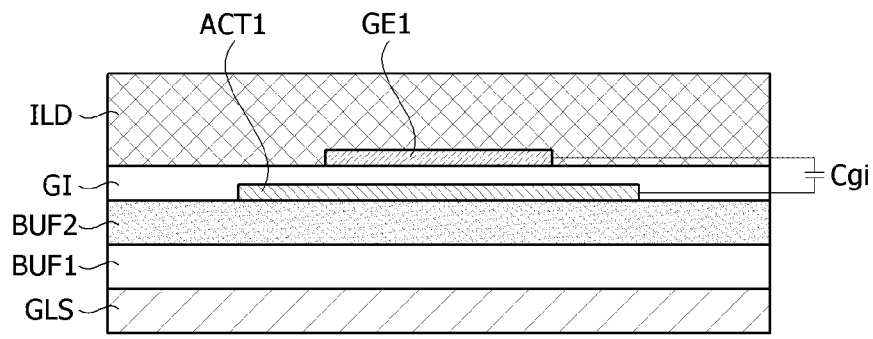
FIG. 7B is an enlarged cross-sectional view of a lower structure of a first TFT in FIG. 6B while omitting the first and second electrodes.

FIGS. 6A and 6B are cross-sectional views illustrating a cross-sectional structure of the display panel 100 according to an embodiment of the present disclosure. The display panel 100 shown in FIGS. 6A and 6B has a top emission panel structure in which light is emitted in an opposite direction of a substrate SUBS, i.e., upward.

Referring to FIGS. 6A and 6B, the substrate SUBS may be made of a plate-shaped plastic substrate, alkali-free glass, or non-alkali glass. The glass substrate SUBS is more resistant to impact than the plastic substrate and is not easily deformed.

The circuit layer 12 is formed on the substrate SUBS. The circuit layer 12 includes at least first and second TFTs TFT1 and TFT2, a capacitor connected to the TFTs TFT1 and TFT2, and circuit wires.

The circuit layer 12 includes a plurality of metal layers, a semiconductor layer, and a plurality of insulating layers BUF1, BUF2, GI, ILD, PAC1, and PAC2.

A first metal layer is disposed on the substrate SUBS. The first metal layer may be formed of a double metal layer of Cu/MoTi, but is not limited thereto. The first metal layer includes a first metal pattern LS1. The first metal pattern LS1 includes a first-first metal pattern FFMP overlapping a first semiconductor pattern ACT1 under the first TFT TFT1 and a first-second metal pattern FSMP overlapping a second semiconductor pattern ACT2 under the second TFT TFT2. The first metal pattern LS1 is disposed under the semiconductor patterns ACT1 and ACT2 of the TFTs TFT1 and TFT2 to block light irradiated to the semiconductor patterns ACT1 and ACT2. While the term "metal pattern" is used throughout the specification, such term is replaceable with the term "conductive pattern." Accordingly, any conductive material may take the place of a metal in one or more embodiments of the present disclosure.

The first metal pattern LS1 may be disposed, as shown in FIG. 6A, under each of the first and second TFTs TFT1 and TFT2. The first-first metal pattern FFMP under the first TFT TFT1 may be connected to a second electrode (or source electrode) SE1 of the first TFT TFT1. In another embodiment, as shown in FIG. 6B, the first-first metal pattern LS1 may not be disposed under the first TFT TFT1.

A first insulating layer BUF1 is formed of an inorganic insulating material to cover the first metal pattern LS1 of the first metal layer. The first insulating layer BUF1 may be formed of a structure, e.g., SiO2/SiNx, in which an oxide layer and a nitride layer are stacked, but is not limited thereto. The first insulating layer BUF1 serves as a dielectric layer that forms the capacitor Cst of the pixel circuit, and serves as an insulating layer that insulates the first metal layer from a second metal layer. In one embodiment, the thickness of the first insulating layer BUF1 is preferably set to 500 Å to 3000 Å in consideration of the capacitance of the capacitor Cst.

The second metal layer is disposed on the first insulating layer BUF1. The second metal layer may be formed of MoTi, but is not limited thereto. The second metal layer includes a second metal pattern LS2.

The second metal pattern LS2 is disposed under the semiconductor pattern ACT2 of the second TFT TFT2 to block light irradiated to the semiconductor pattern ACT2. The second metal pattern LS2 may overlap the semiconductor pattern ACT2 of the second TFT TFT2 and at least partially overlap the first metal pattern LS1 under the second TFT TFT2.

A voltage may be applied to the first and second metal patterns LS1 and LS2. When the second TFT TFT2 is a transistor of the pixel circuit, a variable voltage may be applied in a driving stage of the pixel circuit. When the second TFT TFT2 is implemented with a four-terminal transistor, the second metal pattern LS2 may be used as a second gate electrode (or bottom gate electrode) to which a back bias for shifting the threshold voltage of the second TFT TFT2 to a voltage higher than 0 V is applied.

The second insulating layer BUF2 includes an inorganic insulating material, e.g., $SiO_2$, and covers the second metal pattern LS2 of the second metal layer and the first insulating layer BUF1. The second insulating layer BUF2 insulates the second metal layer from the semiconductor layer. The second insulating layer BUF2 has a thickness the same as or different from that of the first insulating layer BUF1. For example, the thickness of the second insulating layer BUF2 may be set to approximately 2500 Å, but is not limited thereto.

The semiconductor layer is disposed on the second insulating layer BUF2. The semiconductor layer may be formed of an oxide semiconductor, e.g., indium gallium zinc oxide (IGZO), but is not limited thereto. The semiconductor layer includes the semiconductor patterns ACT1 and ACT2 of the first and second TFTs TFT1 and TFT2.

The semiconductor pattern ACT1 of the first TFT TFT1 is in contact with first and second electrodes DE1 and SE1 and overlaps a gate electrode GE1. When the first TFT TFT1 is turned on, a channel current flows through the semiconductor pattern ACT1. The semiconductor pattern ACT2 of the second TFT TFT2 is in contact with first and second electrodes DE2 and SE2 and overlaps a gate electrode GE2. When the second TFT TFT2 is turned on, a channel current flows through the semiconductor pattern ACT2.

The oxide semiconductor layer may be selectively conductive at least in part, for example, at a portion in contact with the first and second electrodes DE1, SE1, DE2, and SE2 and at a portion of a conductive semiconductor pattern MACT connected to the capacitor Cst. In a dry etching process of a thin film layer positioned on the oxide semiconductor layer, an exposed portion of the oxide semiconductor layer may become conductive. As another example, the oxide semiconductor may be made conductive by a doping method. In channel portions under the gate electrodes GE1 and GE2 of the TFTs TFT1 and TFT2, the oxide semiconductor layer does not become conductive.

A third insulating layer GI is formed of an inorganic insulating material on the semiconductor layer and the second insulating layer BUF2 to cover the semiconductor layer and the second insulating layer BUF2. The third insulating layer GI may be formed of an oxide layer $SiO_2$, but is not limited thereto. The third insulating layer GI covers the semiconductor patterns ACT1, ACT2, and MACT. The third insulating layer GI insulates the semiconductor layer from a third metal layer. The third insulating layer GI may have a thickness smaller than that of the second insulating layer BUF2. For example, the thickness of the third insulating layer GI may be set to about 1500 Å, but is not limited thereto.

The third metal layer is disposed on the third insulating layer GI. The third metal layer may be formed of a double metal layer of Cu/MoTi, but is not limited thereto. The third metal layer includes at least a gate line and the gate electrodes GE1 and GE2 of the TFTs TFT1 and TFT2 connected to the gate line. The gate electrode GE1 of the first TFT TFT1 overlaps the semiconductor pattern ACT1 with the third insulating layer GI interposed therebetween. The gate electrode GE2 of the second TFT TFT2 overlaps the semiconductor pattern ACT2 with the third insulating layer GI interposed therebetween.

A fourth insulating layer ILD is formed of an inorganic insulating material on the third metal layer and the third insulating layer GI to cover the third metal layer and the third insulating layer GI. The fourth insulating layer ILD may be formed of a structure, e.g., $SiNx/SiO_2$, in which a nitride layer and an oxide layer are stacked, but is not limited thereto.

A fourth metal layer is disposed on the fourth insulating layer ILD. The fourth metal layer includes at least a data line, the first and second electrodes DE1, DE2, SE1, and SE2 of the first and second TFTs TFT1 and TFT2 connected to the data line, and a jumping pattern CE connected to the capacitor Cst.

The fourth metal layer may be formed of a double metal structure, e.g., Ti/Al/Ti, including a hydrogen capture layer that blocks hydrogen from penetrating into the semiconductor patterns ACT1 and ACT2 from the encapsulation layer 16, but is not limited thereto. Here, titanium (Ti) in the upper and lower layers of the fourth metal layer may serve as the hydrogen capture layer. When hydrogen permeates the oxide semiconductor, the oxide semiconductor may become conductive.

The fourth metal layer blocks hydrogen emitted from the encapsulation layer 16 to prevent an undesired portion, e.g., a channel portion of the TFTs TFT1 and TFT2, in the oxide semiconductor, from becoming conductive.

The first and second electrodes DE1 and SE1 of the first TFT TFT1 are brought into contact with the semiconductor pattern ACT1 through first and second contact holes penetrating the third and fourth insulating layers GI and ILD. As shown in FIG. 6A, the second electrode SE1 of the first TFT TFT1 may be brought into contact with the first metal pattern LS1 through a third contact hole penetrating the first to fourth insulating layers BUF1, BUF2, GI, and ILD.

The first and second electrodes DE2 and SE2 of the second TFT TFT2 are brought into contact with the semiconductor pattern ACT2 through fourth and fifth contact holes penetrating the third and fourth insulating layers GI and ILD. The second electrode SE2 of the second TFT TFT2 may be brought into contact with the second metal pattern LS2 through a sixth contact hole penetrating the second to fourth insulating layers BUF2, GI, and ILD.

The jumping pattern CE is brought into contact with a conductive semiconductor pattern MACT through a seventh-first contact hole penetrating the third and fourth insulating layers GI and ILD, and brought into contact with the first metal pattern LS1 through a seventh-second contact hole penetrating the first to fourth insulating layers BUF1, BUF2, GI, and ILD.

A fifth insulating layer PAC1 is a thick organic film disposed on the fourth insulating layer ILD to cover the fourth metal layer and the fourth insulating layer ILD. The fifth insulating layer PAC1 may be formed of polyimide (PI), but is not limited thereto. The fifth insulating layer PAC1 covers the fourth metal layer and planarizes the surface. The fifth insulating layer PAC1 has a thickness greater than that of each of the first to fourth insulating layers BUF1, BUF2, GI, and ILD. Since the fifth insulating layer PAC1 is formed of a thick organic film having a low dielectric constant, the parasitic capacitance between the fourth metal layer and the fifth metal layer is reduced or minimized to allow patterns of the fourth metal layer and patterns of a fifth metal layer to overlap each other. Accordingly, the fifth insulating layer PAC1 reduces the load of the display panel 100 and enables high-resolution design.

The fifth metal layer is disposed on the fifth insulating layer PAC1. The fifth metal layer includes at least a fifth-first metal pattern SD21 disposed above the first TFT TFT1, a fifth-second metal pattern SD22 disposed above the second TFT TFT2, and a fifth-third metal pattern SD23 connecting an anode electrode ANO of the light emitting element EL to the second electrode SE2 of the second TFT TFT2.

The fifth-first metal pattern SD21 overlaps the first and second electrodes DE1 and SE1 of the first TFT TFT1 to block a hydrogen permeation path from the encapsulation layer 16, thereby preventing the semiconductor pattern ACT1 of the first TFT TFT1 from becoming conductive. The fifth-first metal pattern SD21 may expose the gate electrode GE1 of the first TFT TFT1. The fifth-second metal pattern SD22 overlaps the first and second electrodes DE2 and SE2 of the second TFT TFT2 to block the hydrogen permeation path from the encapsulation layer 16, thereby preventing the semiconductor pattern ACT2 of the second TFT TFT2 from becoming conductive.

The fifth-third metal pattern SD23 is brought into contact with the second electrode SE2 of the second TFT TFT2 through an eighth contact hole penetrating the fifth insulating layer PAC1. The fifth metal layer may be formed of a double metal structure, e.g., Ti/Al/Ti, including a hydrogen capture layer that blocks hydrogen from penetrating into the semiconductor patterns ACT1 and ACT2 from the encapsulation layer 16, but is not limited thereto. Here, titanium (Ti) in the upper and lower layers of the fifth metal layer may serve as the hydrogen capture layer. Accordingly, the fourth and fifth metal layers serve as a double hydrogen capture layer that blocks hydrogen permeable into the semiconductor patterns ACT1 and ACT2.

The power lines of the display panel 100 may be formed of one or more metal patterns among the first to fifth metal layers.

Signals, such as a start pulse and a shift clock, for controlling the shift register may be applied, at the side of the shift register, to the shift register of the gate driver 120 through wires formed from the third and fourth metal layers. In addition, a start pulse, a shift clock, and the like may be applied, at the upper side of the shift register, to the shift register through wires formed from the fourth and fifth metal layers.

A sixth insulating layer PAC2 is a thick organic film disposed on the fifth insulating layer PAC1 to cover the fifth metal layer and the fifth insulating layer PAC1. The sixth insulating layer PAC2 may be formed of polyimide PI, but is not limited thereto. The sixth insulating layer PAC2 covers the fifth metal layer and planarizes the surface. The sixth insulating layer PAC2 has a thickness greater than that of each of the first to fourth insulating layers BUF1, BUF2, GI, and ILD. Since the sixth insulating layer PAC2 is formed of a thick organic film having a low dielectric constant, the parasitic capacitance between the fifth metal layer and the anode electrode ANO of the light emitting element EL is reduced or minimized. The sixth insulating layer PAC2 reduces the load of the display panel 100 and enables high-resolution design.

The light emitting element layer 14 includes the anode electrode ANO of the light emitting element EL, a seventh insulating layer, an organic compound layer OE including an emission layer, a spacer SPC, a cathode electrode CAT of the light emitting element EL, and a plurality of dams DAM disposed in the bezel area BZ.

The anode electrode ANO of the light emitting element EL is formed on the sixth insulating layer PAC2. The anode electrode ANO may be formed of a triple structure of ITO/Ag/ITO including indium tin oxide (ITO) and silver (Ag), but is not limited thereto. The anode electrode ANO is brought into contact with the second electrode SE2 of the second TFT TFT2 through a ninth contact hole penetrating the sixth insulating layer PAC2 and is patterned in a wide pattern overlapping the second TFT TFT2.

A seventh insulating layer is a thick organic film and is formed on the anode electrode ANO of the light emitting element EL and the sixth insulating layer PAC2. The seventh insulating layer may be formed of polyimide (PI), but is not limited thereto. The seventh insulating layer includes a bank pattern BNK. The bank pattern BNK covers the edge of the anode electrode ANO and exposes most of the rest of the anode electrode ANO to define an emission area in each of the pixels.

The spacer SPC is formed by patterning an eighth insulating layer made of a thick organic film. The spacer SPC is disposed on the bank pattern BNK. The spacer SPC may be formed of polyimide (PI), but is not limited thereto.

The organic compound layer OE of the light emitting element EL covers the bank pattern BNK and the spacer SPC. The cathode electrode CAT of the light emitting element EL covers the organic compound layer OE. In each of the pixels, a portion where the anode electrode ANO and the cathode electrode CAT overlap, with the organic compound layer OE interposed therebetween is the emission area that emits light.

The dam DAM is thickly disposed on the edge of the display panel 100 to, when the organic film of the encapsulation layer 16 is coated, prevent the organic film from overflowing. The dam has a thickness in which the sixth insulating layer PAC2, the seventh insulating layer, and the eighth insulating layer are stacked.

A concave trench may be formed at the boundary between pixels on the top surface of the light emitting element layer 14. The trench structure is omitted from the drawing. The trench structure lengthens a path of a leakage current (lateral current) flowing in a lateral direction between the pixels to prevent a phenomenon in which the luminance of the pixels is changed by the interaction between the pixels due to the leakage current.

The encapsulation layer 16 is formed in a stacked structure of a thick first organic film EPAS1, a thin inorganic film PCL, and a thick second organic film EPAS2 to cover the light emitting element layer 14. The touch sensor layer formed on the encapsulation layer 16 is omitted from FIGS. 6A and 6B.

The display panel 100 includes many transistors used for various purposes. The present disclosure improves a sub-threshold slope factor (S-factor) characteristic of a transistor in order to functionally optimize each of the transistors. The S-factor may be adjusted according to a capacitor transmission rate determined according to the capacities of first and second capacitors C1 and C2. The cross-sectional structures of the first and second capacitors C1 and C2 may be changed according to a set value of the capacitor transmission rate.

The S-factor is defined as a gate voltage value to increase the drain current of the transistor by a factor of 10. The S-factor S may be expressed as the reciprocal of a slope value of an I-V transmission curve, i.e., $$S = \frac{\Delta V_{GS}}{\Delta \log(I_{DS})} [V/Dec]$$

in a subthreshold region below the threshold voltage Vth of the driving element DT. As the S-factor increases, the slope of the I-V transmission curve of the transistor decreases. Accordingly, in a transistor having a large S-factor, a current does not change significantly with a small gate voltage change, whereas in a transistor having a small S-factor, the current changes significantly even with a small gate voltage change. The S-factor of this transistor may be controlled by a ratio of a capacitor capacitance Cgi including the third insulating layer GI that covers the semiconductor patterns ACT1 and ACT2 in FIGS. 6A and 6B to a capacitor capacitance Cbuf including the first and second insulating layers BUF1 and BUF2 under the semiconductor patterns ACT1 and ACT2. Accordingly, the S-factor of the transistor may be adjusted using the ratio of Cgi and Cbuf. Cgi denotes the capacitance between the oxide semiconductor pattern ACT1 and the gate electrode GE1. Cbuf denotes the capacitance between the oxide semiconductor pattern ACT1 and the first metal pattern LS1, or the capacitance between the oxide semiconductor pattern ACT2 and the second metal pattern LS2.

Since the capacitor capacitance Cbuf of the first TFT TFT1 is smaller than that of the second TFT TFT2, the S-factor is small. In the case of the first TFT TFT1, as shown in FIGS. 6A, 6B, 7A, and 7B, the dielectric layer of the capacitor capacitance Cbuf includes the first and second insulating layers BUF1 and BUF2, so that the capacitor capacitance Cbuf is small or does not exist. The switch elements T01 to T04 in the pixel circuit, the ESD element, the switch element in the demultiplexer array 112, and the like are required to have fast switching response characteristics. Accordingly, it is beneficial that these transistors are implemented in the same stacked structure as that of the first TFT TFT1. Since the first TFT TFT1 has a fast switching response characteristic, the driving voltage of the transistor may be lowered, so power consumption may be reduced and the size of the transistor may be reduced, thereby reducing the bezel area of the display panel.

Figure 8:
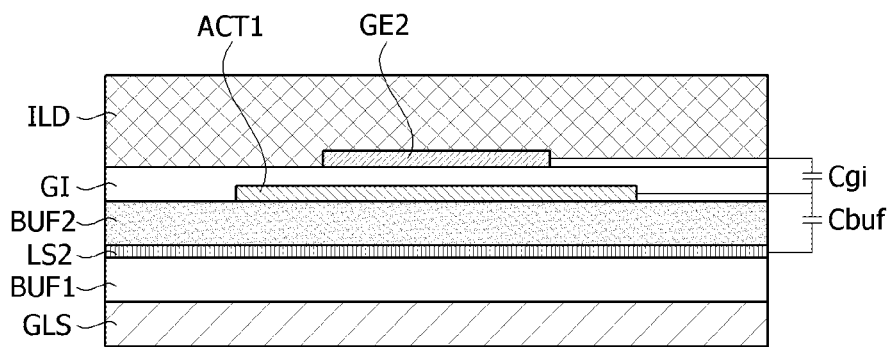
FIG. 8 is an enlarged cross-sectional view of a lower structure of a second TFT in FIGS. 6A and 6B while omitting the first and second electrodes.

In the case of the second TFT TFT2, as shown in FIGS. 6A, 6B, and 8, the dielectric layer of the capacitor capacitance Cbuf includes only the second insulating layer BUF2, and thus the capacitor capacitance Cbuf is relatively large. In the second TFT TFT2, a current does not change sensitively according to the amount of change in the gate voltage. Accordingly, the driving element DT of the pixel circuit is implemented with the same stacked structure as that of the second TFT TFT2. The second TFT TFT2 may improve image quality by improving low grayscale unevenness caused by a threshold voltage deviation according to process deviation of the display panel 100 and accumulation of use time.

Figure 9:
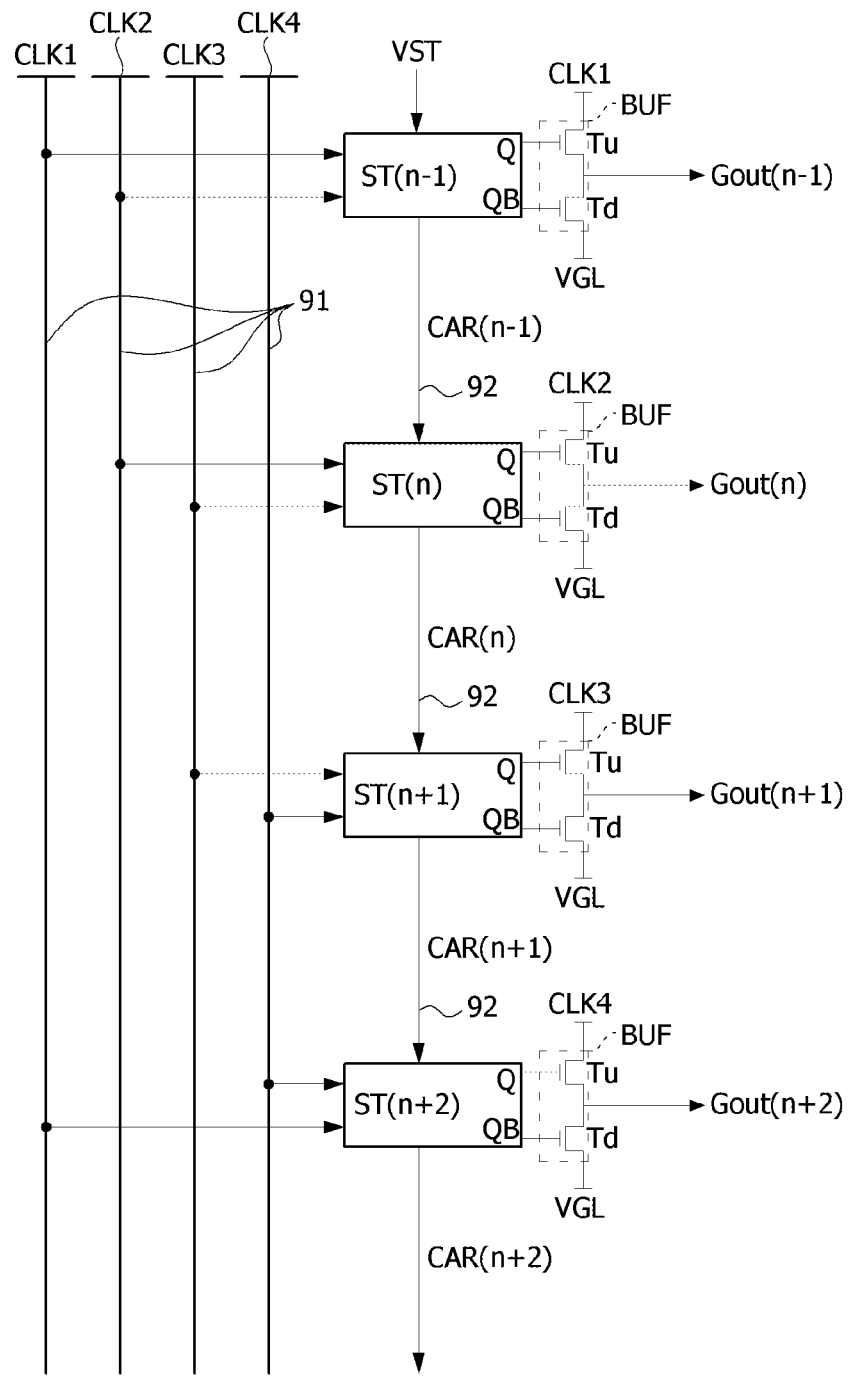
FIG. 9 is a schematic block diagram illustrating a gate driver.

FIG. 9 is a schematic block diagram illustrating a gate driver 120. Referring to FIG. 9, the gate driver 120 sequentially outputs gate pulses [Gout(n−1) to Gout(n+2)] using a shift register. The shift register includes signal transmitters [ST(n−1) to ST(n+2)] that are connected to each other in a cascade manner.

The signal transmitters [ST(n−1) to ST(n+2)] are commonly connected to clock lines 91 to which shift clocks CLK1 to CLK4 are applied. The signal transmitters [ST(n−1) to ST(n+2)] are cascade-connected through a carry line 92 to which carry pulses [CAR(n−1) to CAR(n+1)] are applied.

Each of the signal transmitters [ST(n−1) to ST(n+2)] includes a VST node to which a start pulse VST is inputted, a CLK node to which shift clocks [CLK1 to CLK4] are inputted, a first output node from which gate pulses [Gout (n−1) to Gout(n+2)] are outputted, and a second output node from which carry pulses [CAR n−1) to CAR(n+2)] are outputted. The gate pulses [Gout(n−1) to Gout(n+2)] and the carry pulses [CAR(n−1) to CAR(n+2)] may be outputted through a common output node. In this case, the second output node and the first output node may be connected to one common output node.

The start pulse VST is generally inputted to a first signal transmitter. In the example of FIG. 9, an (n−1)$^{th}$ signal transmitter [ST(n−1)] may be a first signal transmitter. The shift clocks [CLK1 to CLK4] may be 4-phase clocks, but are not limited thereto. For example, the shift clocks [CLK1 to CLK4] may be M-phase clocks (M is a positive integer equal to or greater than 2).

The signal transmitters [ST(n) to ST(n+2)] connected to the (n−1)$^{th}$ signal transmitter [ST(n−1)] in a cascade manner are started to be driven when receiving the carry pulses [CAR(n−1) to CAR(n+2)] as a start pulse from their respective preceding signal transmitters. The signal transmitters [ST(n−1) to ST(n+2)] may output the carry pulses [CAR (n−1) to CAR(n+2)] through their second output nodes while outputting the gate pulses [Gout(n−1) to Gout(n+2)] through their first output nodes, respectively.

Each of the signal transmitters [ST(n−1) to ST(n+2)] includes a first control node Q, a second control node QB, and a buffer BUF. The buffer BUF outputs a gate pulse to a gate line 103 through an output node by a pull-up transistor Tu and a pull-down transistor Td.

The buffer BUF rises the voltage of the first output node up to a gate-on voltage VGH by supplying the voltage of the shift clocks [CLK1 to CLK4] to the first output node when the shift clocks [CLK1 to CLK4] are inputted while the first control node Q is charged, and inverts the voltage of the gate pulses [Gout(n−1) to Gout(n+2)] into a gate-off voltage VGL by discharging the first output node when the second control node QB is charged.

The pull-up transistor Tu includes a gate electrode connected to the first control node Q, a first electrode connected to a CLK node to which the shift clocks [CLK1 to CLK4] are inputted, and a second electrode connected to the first output node. The pull-down transistor Td includes a gate electrode connected to the second control node QB, a first electrode connected to the first output node, and a second electrode connected to a VSS node to which the gate-off voltage VGL is applied.

An inverter (not shown) is connected between the first control node Q and the second control node QB. Therefore, the voltage of the second control node QB is a low voltage when the voltage of the first control node Q is a high voltage, whereas the voltage of the second control node QB is a high voltage when the voltage of the first control node Q is a low voltage.

Each of the signal transmitters [ST(n−1) to ST(n+2)] may charge and discharge the first and second control nodes Q and QB using a plurality of transistors. In this connection, all transistors constituting the signal transmitters [ST(n−1) to ST(n+2)] may be implemented as n-channel oxide transistors.

A carry pulse from a succeeding signal transmitter may be inputted to a reset node of the signal transmitters [ST(n−1) to ST(n+2)]. The signal transmitters [ST(n−1) to ST(n+2)] may discharge the first control node Q in response to a carry pulse from the succeeding signal transmitter.

Figure 10A:
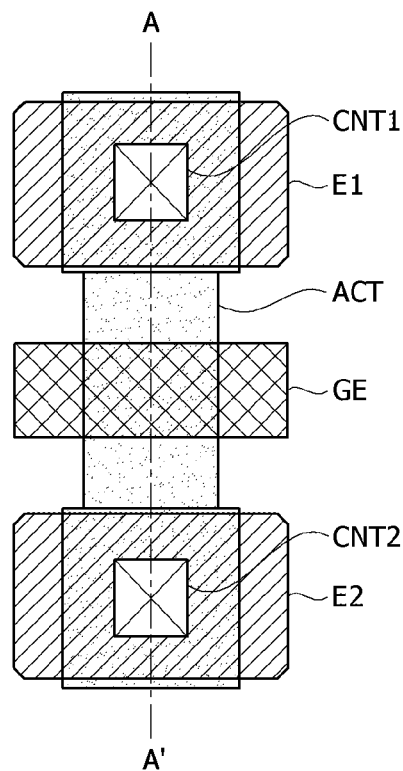
FIGS. 10A and 10B are diagrams illustrating a transistor having a coplanar structure.
Figure 10B:
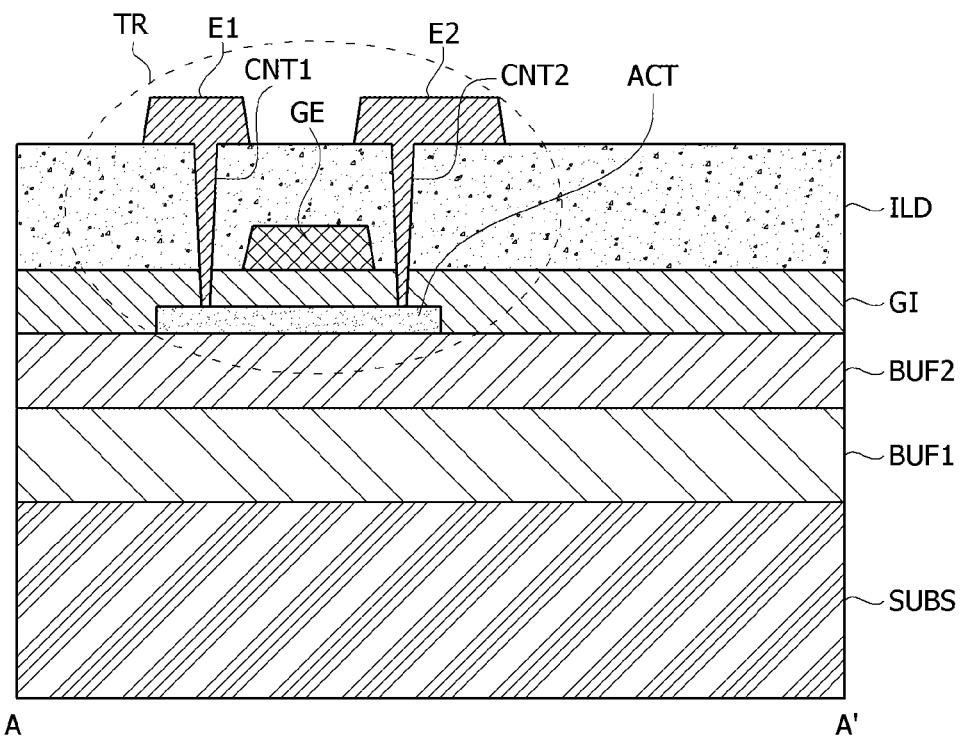

All transistors constituting the signal transmitters [ST(n−1) to ST(n+2)] may be implemented as n-channel oxide TFTs having a single gate and a coplanar structure shown in FIG. 10B. FIG. 10B is a cross-sectional view taken along lines A-A' in FIG. 10A. For the transistor shown in FIGS. 10A and 10B, the metal patterns LS1 and LS2 are not disposed under the transistor.

Referring to FIGS. 10A and 10B, a transistor TR includes a gate electrode GE disposed on an oxide semiconductor pattern ACT with a third insulating layer GI interposed therebetween, and first and second electrodes E1 and E2 disposed on the oxide semiconductor pattern ACT with third and fourth insulating layers GI and ILD interposed therebetween. The first electrode E1 contacts one side of the oxide semiconductor pattern ACT through a first contact hole CNT1 penetrating the third and fourth insulating layers GI and ILD. The second electrode E2 contacts the other side of the oxide semiconductor pattern ACT through a second contact hole CNT2 penetrating the third and fourth insulating layers GI and ILD.

First to third insulating layers BUF1, BUF2, and GI exist and there are no metal patterns LS1 and LS2 between the transistor TR and a substrate SUBS.

The gate-source voltage Vgs of the transistor TR shown in FIGS. 10A and 10B may be Vgs=0V. When a threshold voltage of the transistor TR shown in FIGS. 10A and 10B shifts toward a negative voltage less than 0V, a leakage current may occur, which may lead to an increase in power consumption. In the case of the transistor TR illustrated in FIGS. 10A and 10B, a leakage current may be generated at Vth=0V due to the steep slope of the S-factor at Vgs=0V.

It is beneficial to improve power consumption by satisfying ideal device requirement characteristics required for each role of the transistors constituting the signal transmitters [ST(n−1) to ST(n+2)] and preventing a leakage current even when a threshold voltage is shifted. To this end, the transistors constituting the signal transmitters [ST(n−1) to ST(n+2)] may have different cross-sectional structures applied for their respective roles. The signal transmitters [ST(n−1) to ST(n+2)] may be implemented with two or more transistors among the transistors illustrated in FIGS. 11A to 13E.

FIGS. 11A to 13E are diagrams illustrating cross-sectional structures of transistors applicable to a gate driver 120.

Figure 11A:
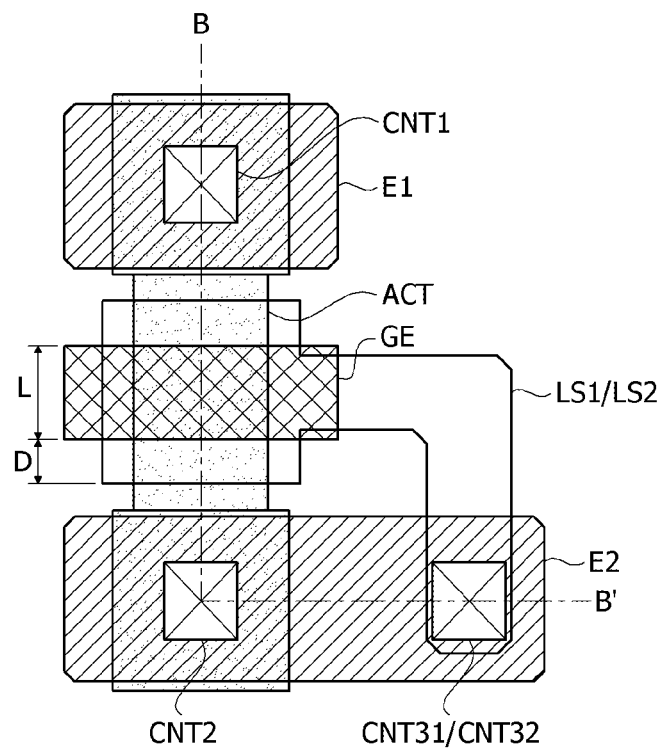
FIGS. 11A to 11D are diagrams illustrating examples in which metal patterns disposed under a transistor is connected to one electrode of the transistor.
Figure 11B:
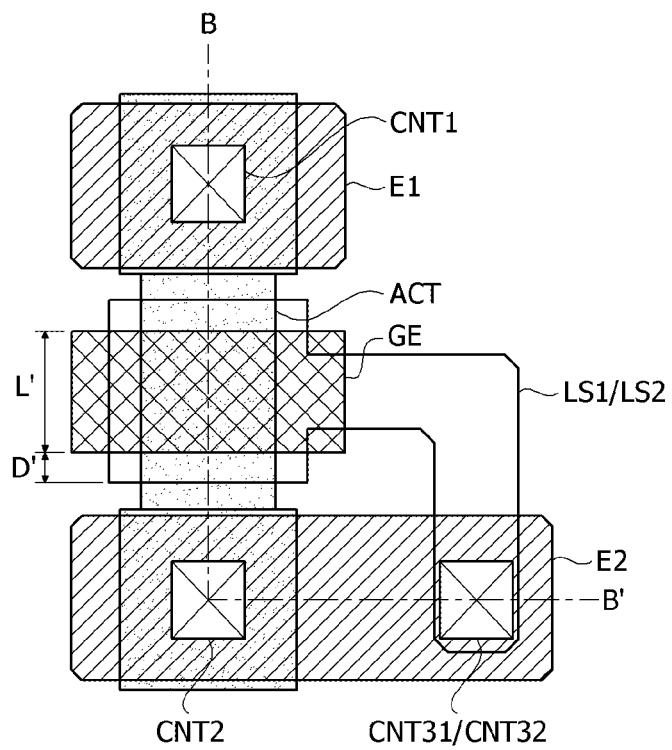
Figure 11C:
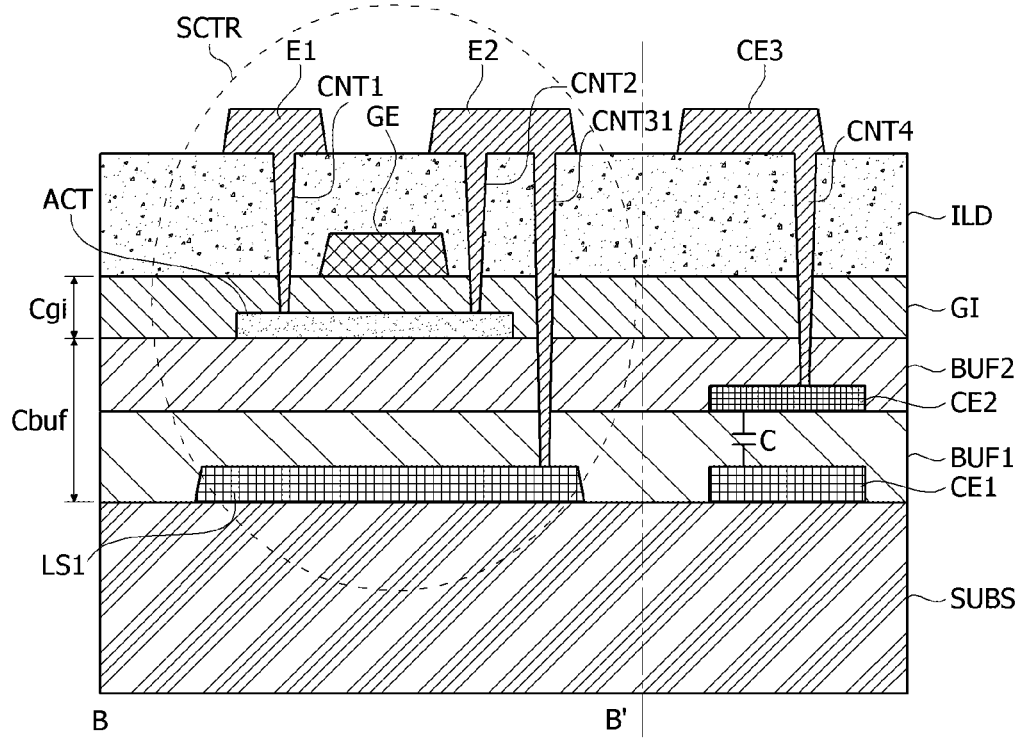
Figure 11D:
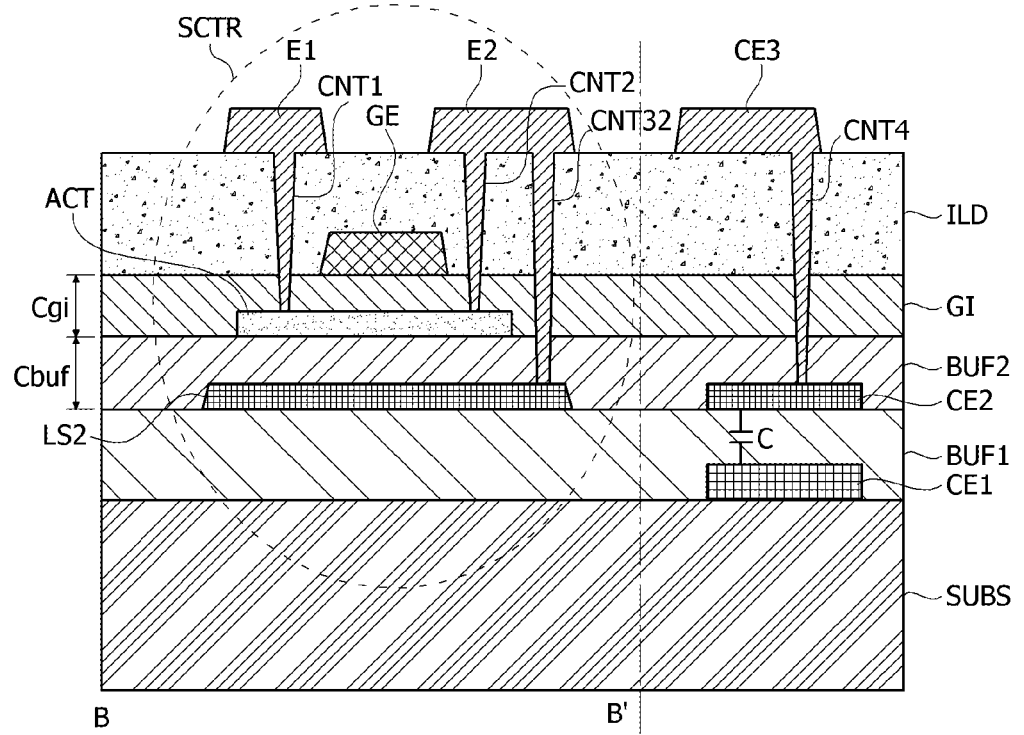

FIGS. 11A to 11D are diagrams illustrating examples in which metal patterns LS1 and LS2 disposed under a transistor SCTR are connected to one electrode of the transistor SCTR. FIGS. 11C and 11D are cross-sectional views illustrating a cross-sectional structure of the transistor SCTR taken along lines B-B' in a plan view of FIGS. 11A and 11B.

Referring to FIGS. 11A and 11B, a transistor SCTR having a source contact structure includes a gate electrode GE disposed on an oxide semiconductor pattern ACT with a third insulating layer GI interposed therebetween, and first and second electrodes E1 and E2 disposed on the oxide semiconductor pattern ACT with third and fourth insulating layers GI and ILD interposed therebetween. The first electrode E1 is in contact with one side of the oxide semiconductor pattern ACT through a first contact hole CNT1 penetrating the third and fourth insulating layers GI and ILD. The second electrode E2 is in contact with the other side of the oxide semiconductor pattern ACT through a second contact hole CNT2 penetrating the third and fourth insulating layers GI and ILD.

A first metal pattern LS1 patterned from a first metal layer or a second metal pattern LS2 patterned from a second metal layer is disposed under the oxide semiconductor pattern ACT. The second electrode E2 of the transistor SCTR may be connected to the first metal pattern LS1 patterned from the first metal layer or the second metal pattern LS2 patterned from the second metal layer. As shown in FIG. 11C, the second electrode E2 may be brought into contact with the first metal pattern LS1 through a third-first contact hole CNT31 penetrating insulating layers BUF1, BUF2, GI, and ILD. As shown in FIG. 11D, the second electrode E2 may be brought into contact with the second metal pattern LS2 through a third-second contact hole CNT32 penetrating the insulating layers BUF2, GI and ILD.

As shown in FIGS. 11C and 11D, the first metal pattern LS1 or the second metal pattern LS2 disposed under the transistor SCTR may be connected to the second electrode E2, so that an equipotential voltage, which is the same as the voltage of the second electrode E2, can be applied. The second electrode E2 may be a source electrode of the transistor SCTR. It may serve as a second gate electrode for shifting a threshold voltage of the transistor SCTR toward a positive voltage.

An S-factor of the transistor may be adjusted according to a ratio of Cgi and Cbuf. For example, as the capacitance of Cgi is smaller and the capacitance of Cbuf is larger, the threshold voltage of the transistor SCTR is further shifted toward the positive voltage and a subthreshold swing (SS) [V/dec] is increased. When the second electrode E2 is connected to the second metal pattern LS2 rather than the first metal pattern LS1, the threshold voltage shift amount and the subthreshold swing (SS) are greater.

A circuit for the signal transmitter in the gate driver 120 may include a capacitor C. The capacitor C includes a first electrode CE1 separated from the first metal layer, a second electrode CE2 separated from the second metal layer, and a second insulating layer BUF1 existed between the first and second electrodes CE1 and CE2. A metal pattern separated from the third metal layer or a metal pattern CE3 separated from the fourth metal layer may be connected to a second electrode CE2 of the capacitor C through a fourth contact hole CNT4 penetrating the insulating layers BUF2, GI, and ILD.

The transistor SCTR includes a semiconductor channel through which a current flows between the first and second electrodes E1 and E2. In the semiconductor channel, the oxide semiconductor pattern ACT and the gate electrode GE overlap each other. The stress of the transistor SCTR may be relieved by appropriately adjusting the area ratio of the length L and the width W of the semiconductor channel. For example, in the case where the length of the semiconductor channel increases to L' as shown in FIG. 11B, the level of a high voltage drain stress (HVDS) of the transistor may be lowered when a drain-source voltage Vds is greatly applied. L=2.5 to 8.5 μm in FIG. 11A and L'=5.5 to 11.5 μm in FIG. 11B, but are not limited thereto. In a portion where the oxide semiconductor pattern ACT, the gate electrode GE, and the metal patterns LS1 and LS2 overlap, the lengths D and D1 between the end of the gate electrode GE and the metal patterns LS1/LS2 may be 0.5 to 3 μm. When the length of the semiconductor channel is lengthened to L', D is reduced to D'.

Figure 12A:
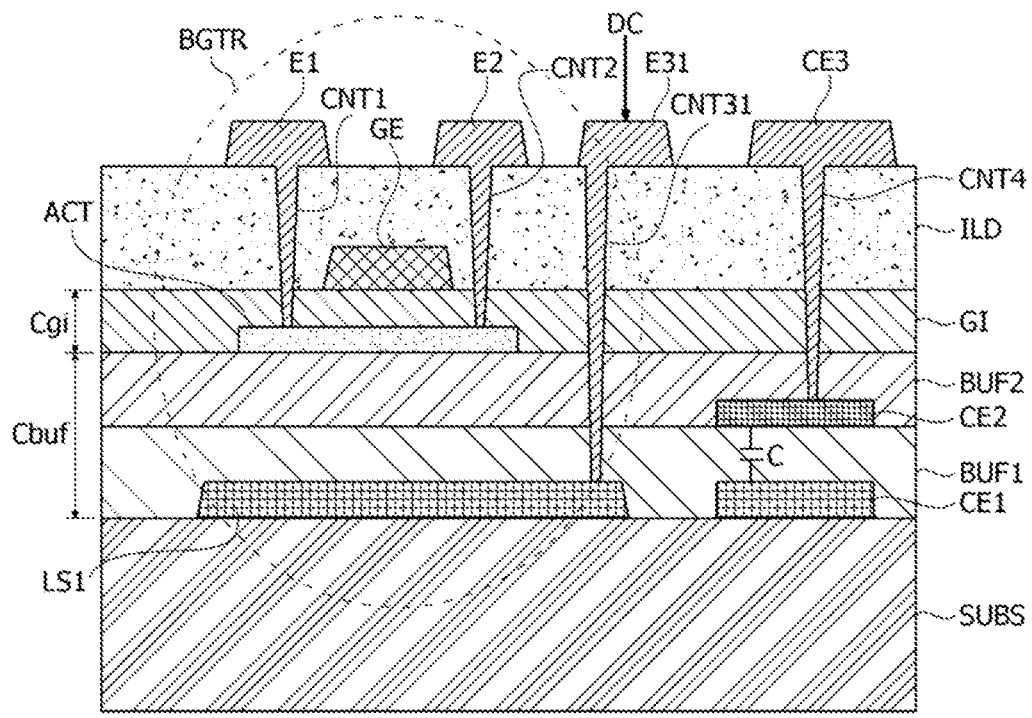
FIGS. 12A and 12B are cross-sectional views illustrating examples in which metal patterns to which separate constant voltages are applied are disposed under a transistor.
Figure 12B:
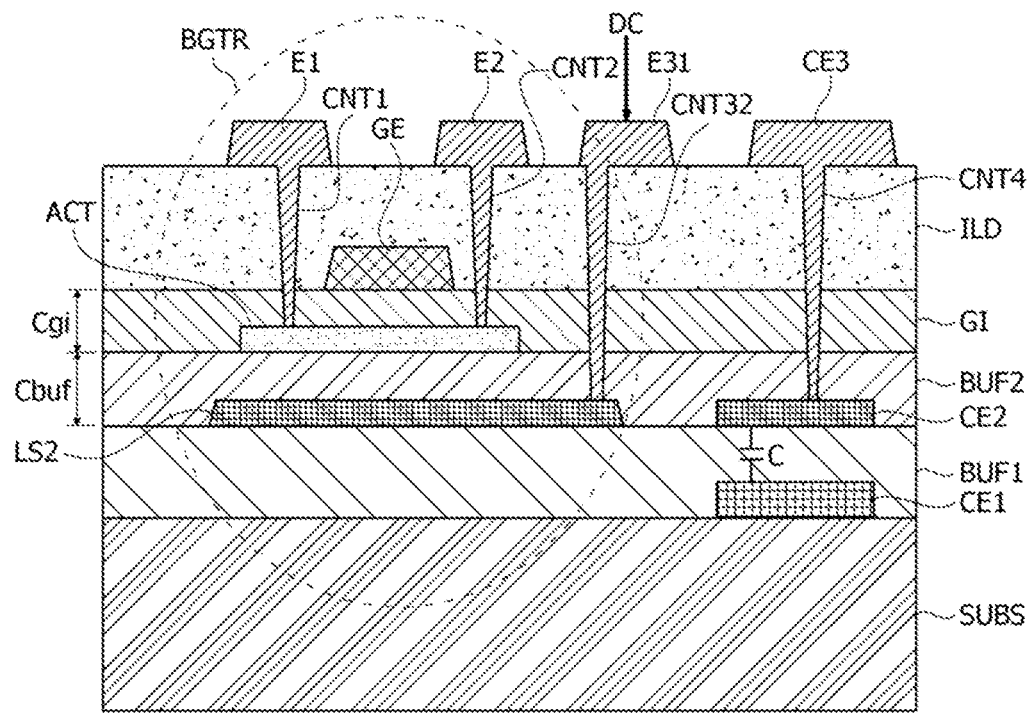
Figure 12C:
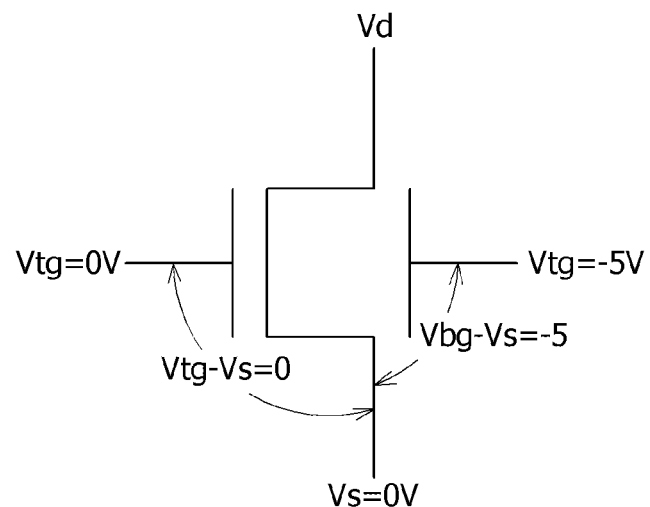
FIG. 12C is an equivalent circuit diagram of the transistor shown in FIGS. 12A and 12B.

FIGS. 12A and 12B are cross-sectional views illustrating examples in which metal patterns LS1 and LS2 to which separate constant voltages (DC) are applied are disposed under a transistor BGTR. FIG. 12C is an equivalent circuit diagram of the transistor BGTR illustrated in FIGS. 12A and 12B.

Referring to FIGS. 12A and 12B, the transistor BGTR, which has a back gate, includes a gate electrode GE disposed on an oxide semiconductor pattern ACT with a third insulating layer GI interposed therebetween, and first and second electrodes E1 and E2 disposed on the oxide semiconductor pattern ACT with third and fourth insulating layers GI and ILD interposed therebetween. The first electrode E1 is in contact with one side of the oxide semiconductor pattern ACT through a first contact hole CNT1 penetrating the third and fourth insulating layers GI and ILD. The second electrode E2 is in contact with the other side of the oxide semiconductor pattern ACT through a second contact hole CNT2 penetrating the third and fourth insulating layers GI and ILD.

A first metal pattern LS1 patterned from a first metal layer or a second metal pattern LS2 patterned from a second metal layer is disposed under the transistor BGTR. A constant voltage (DC) may be applied to the first metal pattern LS1 or the second metal pattern LS2 disposed under the transistor BGTR. The constant voltage DC may be applied to the metal pattern E31 connected to the first metal pattern LS1 or the second metal pattern LS2 through the contact hole CNT4 penetrating the insulating layers. In this case, the first metal pattern LS1 or the second metal pattern LS2 disposed under the transistor BGTR may serve as a second gate electrode capable of shifting a threshold voltage of the transistor BGTR to a desired voltage.

As illustrated in FIG. 12C, when a voltage applied to the gate electrode GE is Vtg, a voltage applied to the first electrode E1 is Vd, a voltage applied to the second electrode E2 is Vs, and a constant voltage applied to the first metal pattern LS1 or the second metal pattern LS2 is Vbg, the voltage Vtg may be the constant voltage lower than the voltage Vs. Under the condition that Vbg−Vs<0, an effect of shifting the threshold voltage of the transistor BGTR toward the positive voltage may be obtained. The larger the voltage difference between Vbg and Vs and the larger the capacitance of the Cbuf, the larger the shift amount of the threshold voltage is.

Figure 13A:
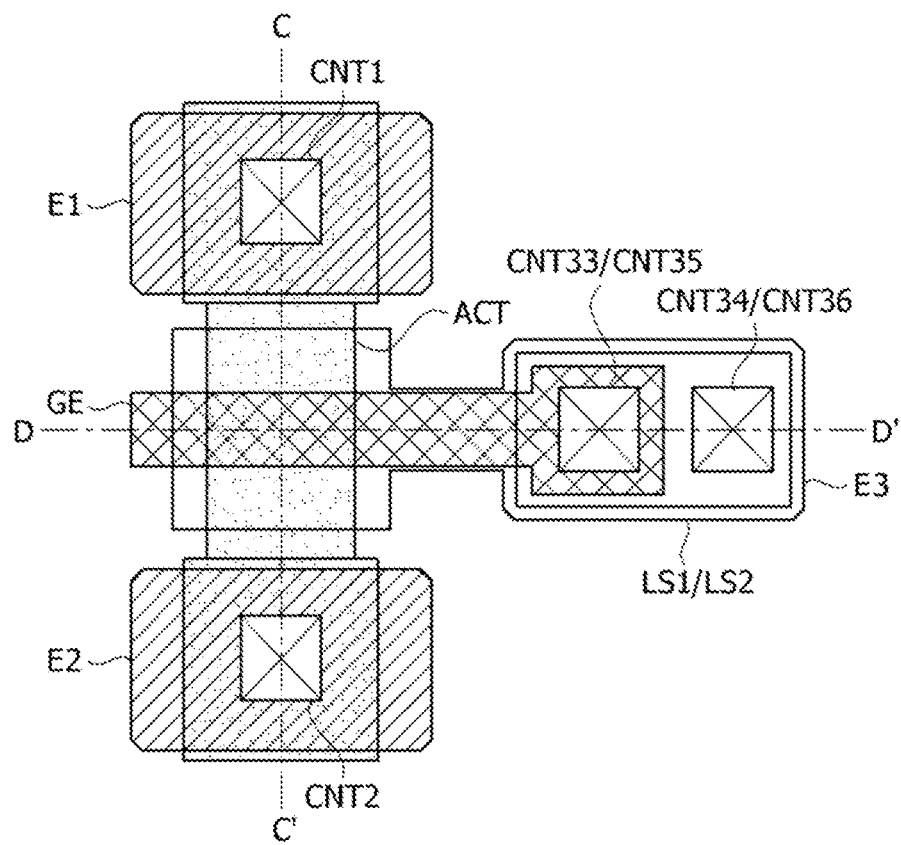
FIGS. 13A to 13E are diagrams illustrating examples in which metal patterns disposed under a transistor is connected to a gate electrode of the transistor.
Figure 13B:
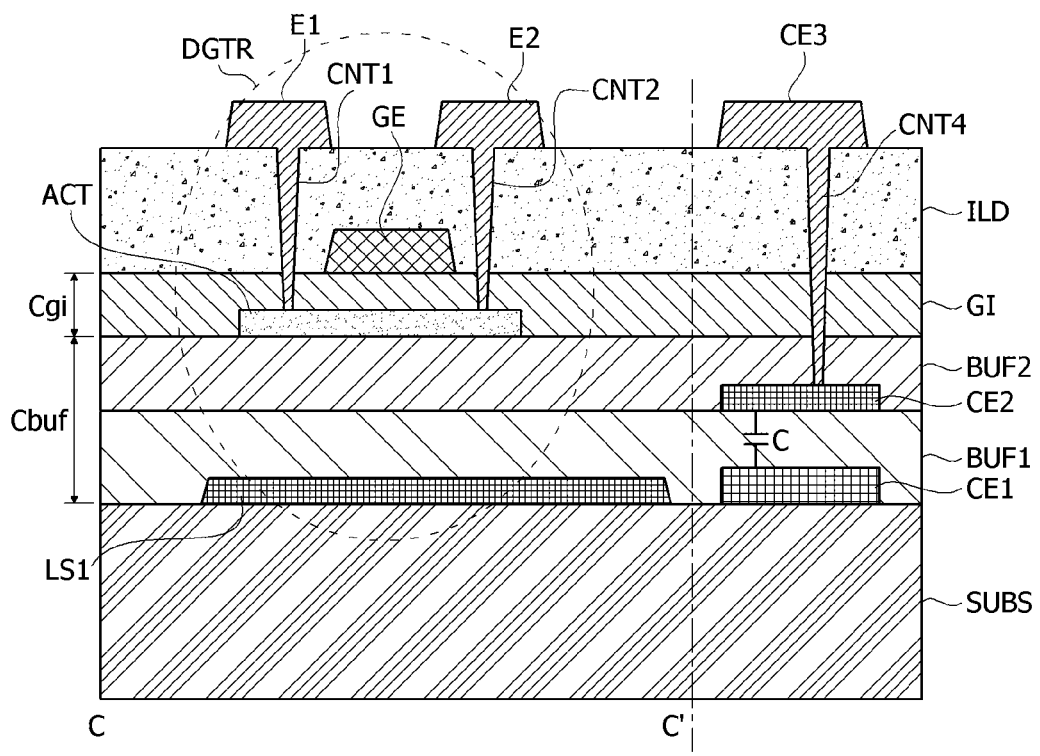
Figure 13C:
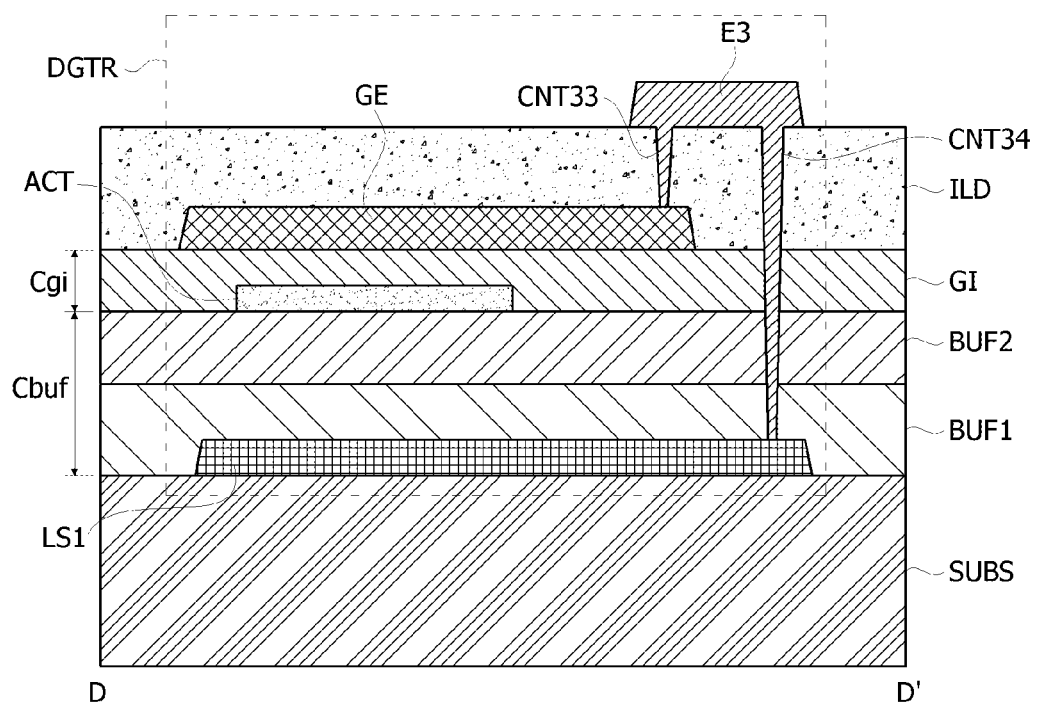
Figure 13D:
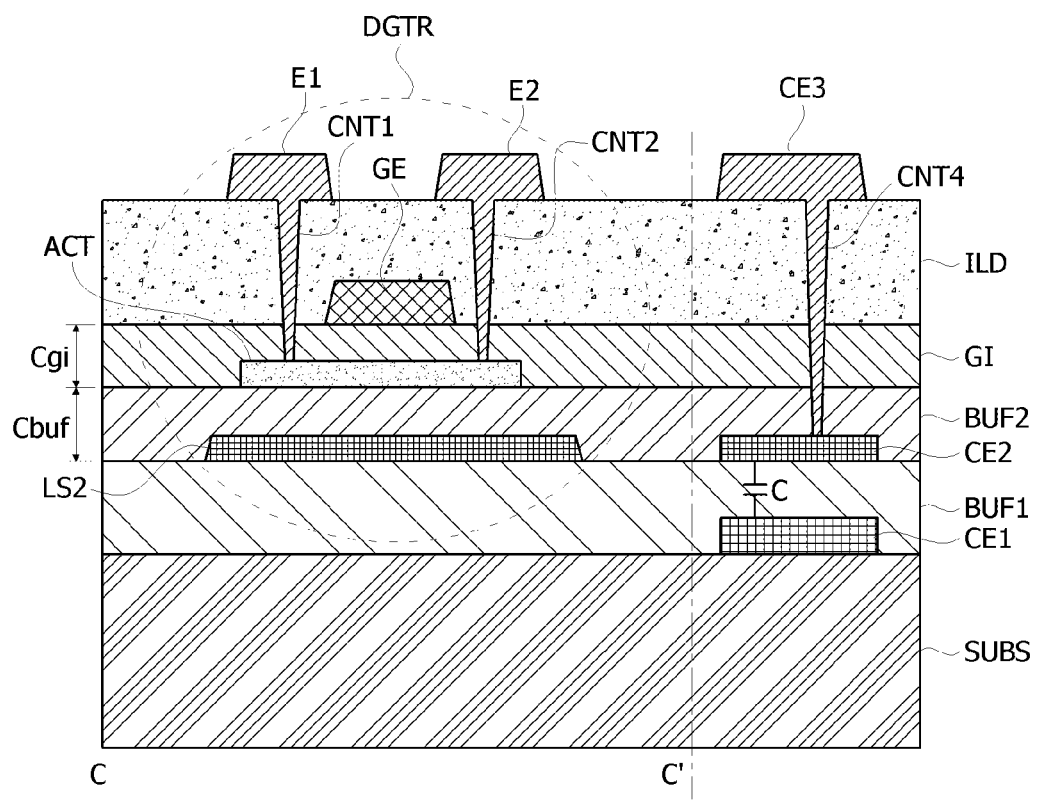
Figure 13E:
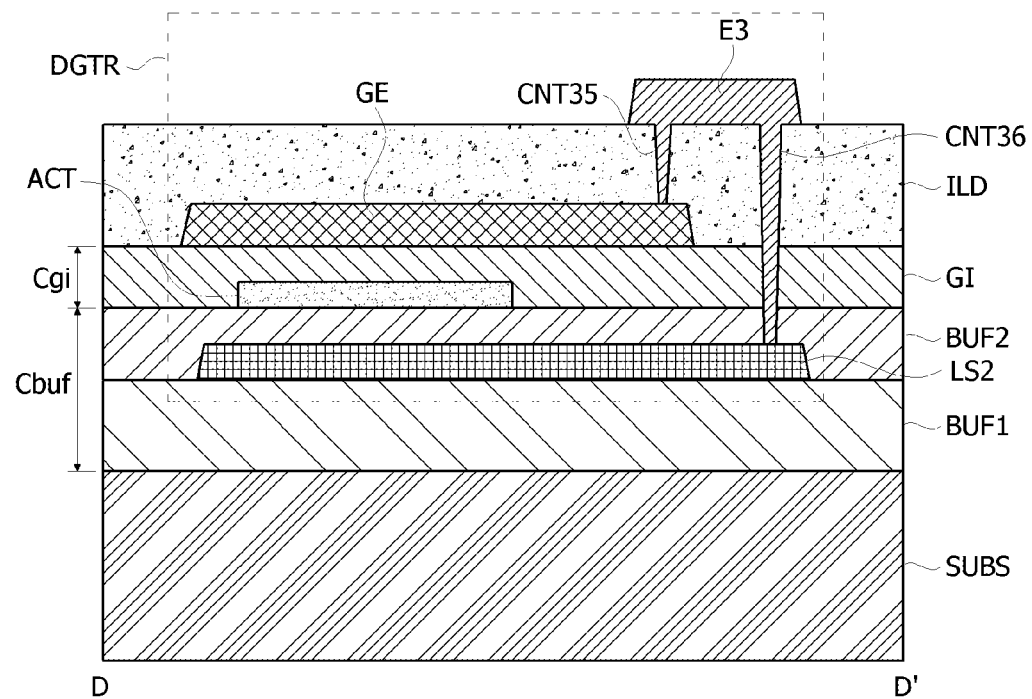

FIGS. 13A to 13E are diagrams illustrating examples in which metal patterns LS1 and LS2 disposed under a transistor DGTR are connected to a gate electrode of the transistor DGTR. FIGS. 13B and 13C are cross-sectional views illustrating cross-sectional structures in which a gate electrode GE of the transistor DGTR is connected to a first metal pattern LS1, taken along lines C-C' and lines D-D' in a plan view of FIG. 13A. FIGS. 13D and 13E are cross-sectional views illustrating cross-sectional structures in which a gate electrode GE of the transistor DGTR is connected to a second metal pattern LS2, taken along lines C-C' and lines D-D' in a plan view of FIG. 13A.

Referring to FIGS. 13A to 13E, a transistor DGTR includes a gate electrode GE disposed on an oxide semiconductor pattern ACT with a third insulating layer GI interposed therebetween, and first and second electrodes E1 and E2 disposed on the oxide semiconductor pattern ACT with third and fourth insulating layers GI and ILD interposed therebetween. The first electrode E1 is in contact with one side of the oxide semiconductor pattern ACT through a first contact hole CNT1 penetrating the third and fourth insulating layers GI and ILD. The second electrode E2 is in contact with the other side of the oxide semiconductor pattern ACT through a second contact hole CNT2 penetrating the third and fourth insulating layers GI and ILD.

A first metal pattern LS1 patterned from a first metal layer or a second metal pattern LS2 patterned from a second metal layer is disposed under the transistor DGTR. The first metal pattern LS1 or the second metal pattern LS2 disposed under the transistor DGTR is brought into contact with the gate electrode GE through a jumping pattern E3 patterned from a fourth metal layer. A jumping pattern E3 may be disposed on the fourth insulating layer ILD. The jumping pattern E3 is disposed on the same plane as the first and second electrodes E1 and E2. The jumping pattern E3, the first electrode E1, and the second electrode E2 are separated from each other.

As illustrated in FIG. 13C, the jumping pattern E3 may be brought into contact with the gate electrode GE through a third-first contact hole CNT33 penetrating the fourth insulating layer ILD, and may be brought into contact with the first metal pattern LS1 through a third-second contact hole CNT34 penetrating insulating layers BUF1, BUF2, GI, and ILD. In another embodiment, as illustrated in FIG. 13E, the jumping pattern E3 may be brought into contact with a gate electrode GE1 through a third-first contact hole CNT35 penetrating the fourth insulating layer ILD, and may be brought into contact with the second metal pattern LS2 through the insulating layers BUF2, GI, and ILD.

In the transistor DGTR, the gate electrode GE and the metal patterns LS1 and LS2 overlapped each other with the oxide semiconductor pattern ACT interposed therebetween apply an equipotential electric field to the oxide semiconductor pattern ACT. Accordingly, an on-current Ion of the transistor DGTR is increased. As a capacitance of the Cbuf is increased, the on-current Ion may be increased.

The first and second metal patterns LS1 and LS2 may be stacked under the oxide semiconductor pattern ACT in the respective transistors SCTR, BGTR, and DGTR illustrated in FIGS. 11A to 13E.

Figure 14:
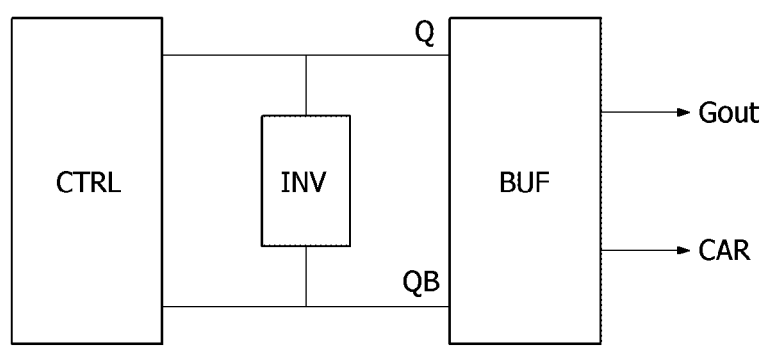
FIG. 14 is a schematic block diagram illustrating a configuration of a signal transmitter in a gate driver.

FIG. 14 is a schematic block diagram illustrating a configuration of a signal transmitter in the gate driver 120.

Referring to FIG. 14, each of the signal transmitters [ST(n-1) to ST(n+2)] includes a control circuit CTRL, an inverter circuit INV, and a buffer BUF.

The control circuit CTRL charges and discharges first and second control nodes Q and QB in response to an input signal. The inverter circuit INV causes the second control node QB to discharge when the first control node Q is charged, and causes the second control node QB to charge when the first control node Q is discharged.

The buffer BUF outputs a gate pulse GOUT to a first output node and outputs a carry pulse CAR to a second output node. The buffer BUF includes a pull-up transistor Tu that rises the gate pulse GOUT and the carry pulse CAR to the gate-on voltage VGH when the first control node Q is charged to the gate-on voltage VGH or higher, and a pull-down transistor Td that lowers the gate pulse GOUT and the carry pulse CAR to the gate-off voltage VGL by discharging the output nodes when the second control node QB is charged to the gate-on voltage VGH or higher.

Each of the control circuit CTRL, the inverter circuit INV, and the buffer BUF includes a plurality of n-channel oxide transistors. At least one of the control circuit CTRL, the inverter circuit INV, and the buffer BUF includes at least two or more n-channel oxide transistors having different cross-sectional structures.

In the signal transmitters [ST(n-1) to ST(n+2)], transistors having a non-fixed source electrode and no leakage current path may be implemented as a transistor DGTR having a cross-sectional structure illustrated in FIGS. 13B to 13E. In the case of the transistor DGTR requiring a high on-current, a gate electrode GE of the transistor DGTR may be connected to the second metal pattern LS2 as shown in FIGS. 13D and 13E.

In the case of transistors having a fixed source electrode in the signal transmitters [ST(n-1) to St(n+2)], a transistor having a good condition in a positive-bias temperature stress (PBTS) and a large leakage current may be implemented as a transistor having a cross-sectional structure illustrated in FIGS. 12A and 12B. In the case of a transistor having a fixed source electrode, when the voltage of the source electrode in FIG. 12C, for example, the second electrode E2, is changed, Vbg—Vs is also changed.

In the case of transistors having a fixed source electrode in the signal transmitters [ST(n-1) to ST(n+2)], a transistor having a poor condition in a PBTS may be implemented as a transistor having a cross-sectional structure illustrated in FIGS. 11C and 11D. When a threshold voltage Vth is shifted to the positive voltage and a characteristic having a large subthreshold swing (SS) [V/dec] is required, it is beneficial to have the transistor SCTR having the cross-sectional structure illustrated in FIG. 11D.

Figure 15:
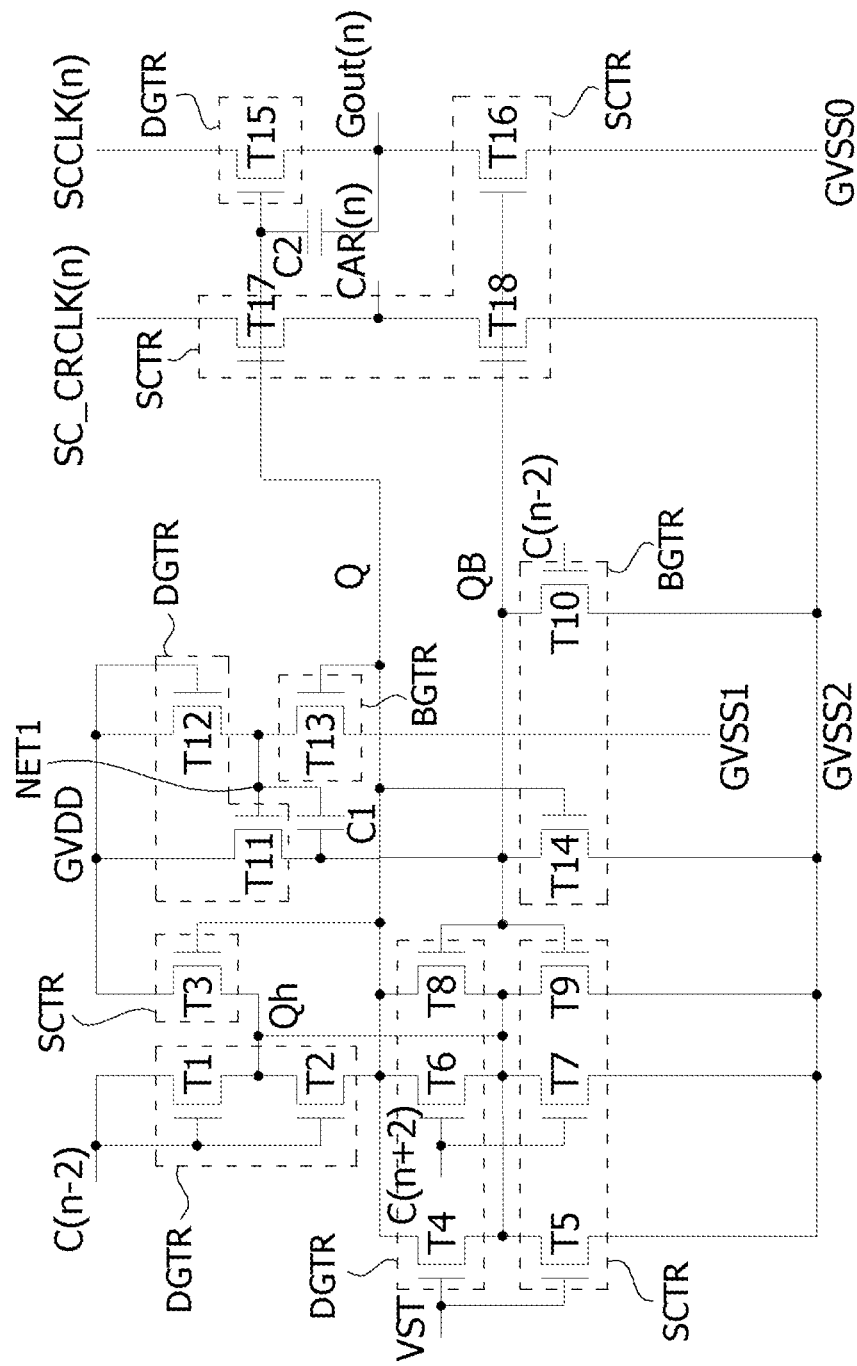
FIG. 15 is a circuit diagram illustrating in detail a signal transmitter according to a first embodiment of the present disclosure.

In the case of transistors having a fixed source electrode in the signal transmitters [ST(n-1) to ST(n+2)], a transistor that undergoes a lot of voltage drain stresses (HVDS) may be implemented as the transistor SCTR having a cross-sectional structure illustrated in FIGS. 11C and 11D, but it is beneficial to make its channel length longer. When a threshold voltage Vth is shifted to a positive voltage and a characteristic having a large subthreshold swing (SS) [V/dec] is required, it is beneficial to have the transistor SCTR having the cross-sectional structure illustrated in FIG. 11D. FIG. 15 is a circuit diagram illustrating in detail a signal transmitter according to a first embodiment of the present disclosure. FIG. 15 illustrates a circuit configuration of an $n^{th}$ signal transmitter [ST(n)]. The remainder of the signal transmitters other than the $n^{th}$ signal transmitter [ST(n)] have substantially the same circuit configuration as the $n^{th}$ signal transmitter [ST(n)].

Referring to FIG. 15, a control circuit CTRL of the $n^{th}$ signal transmitter [ST(n)] may include first to tenth transistors T1 to T10.

The signal transmitters include power nodes to which a constant voltage is applied, for example, a VDD node GVDD to which the gate-on voltage VGH is applied and VSS nodes GVSS0, GVSS1, and GVSS2 to which the gate-off voltage VGL is applied. The gate-off voltage VGL having the same voltage level or the gate-off voltage VGL having different voltage levels may be applied to the VSS nodes GVSS0, GVSS1, and GVSS2.

The first transistor T1 is turned on when a voltage of a first input signal [C(n-2)] is the gate-on voltage VGH to transmit the voltage of the first input signal [C(n-2)] to the first buffer node Qh. The first input signal may be a carrier pulse outputted from a preceding signal transmitter, for example, the $(n-2)^{th}$ signal transmitter [ST(n-2)], but is not limited thereto. The preceding signal transmitter may be an $(n-1)^{th}$ signal transmitter [ST(n-1)]. The first transistor T1 includes a gate electrode and a first electrode to which a first input signal [C(n-2)] is applied, and a second electrode connected to the first buffer node Qh.

The second transistor T2 is turned on when the voltage of the first input signal [C(n-2)] is the gate-on voltage VGH to connect the first buffer node Qh to the first control node Q. The second transistor T2 includes a gate electrode to which the first input signal [C(n-2)] is applied, a first electrode connected to the first buffer node Qh, and a second electrode connected to the first control node Q.

The first and second transistors T1 and T2 are connected in a two transistor series (TTS) structure connected in series. Transistors connected in a TTS structure have little leakage current. Meanwhile, the fourth and fifth transistors T4 and T5 are also connected in a TTS structure, and the sixth and seventh transistors T6 and T7 are also connected in a TTS structure. In addition, the eighth and ninth transistors T8 and T9 and the twelfth and thirteenth transistors T12 and T13 are also connected to in a TTS structure.

The third transistor T3 is turned on when the first control node Q is charged to connect the VDD node GVDD to which the gate-on voltage VGH is applied to the first buffer node Qh, thereby preventing a leakage current of the first control node Q. The third transistor T3 includes a gate electrode connected to the first control node Q, a first electrode connected to the VDD node GVDD, and a second electrode connected to the first buffer node Qh.

The fourth transistor T4 is turned on when a voltage of a second input signal VST is the gate-on voltage VGH to connect the first control node Q to the first buffer node Qh. The second input signal VST may be a start pulse or a carry pulse from a preceding signal transmitter. The fourth transistor T4 includes a gate electrode to which the second input signal VST is applied, a first electrode connected to the first control node Q, and a second electrode connected to the first buffer node Qh.

The fifth transistor T5 is turned on when the voltage of the second input signal VST is the gate-on voltage VGH to connect the first buffer node Qh to a first VSS node GVSS2 to which the gate-off voltage VGL is applied. The second input signal VST may be a start pulse or a carry pulse from a preceding signal transmitter. The fifth transistor T5 includes a gate electrode to which the second input signal VST is applied, a first electrode connected to the first buffer node Qh, and a second electrode connected to the first VSS node GVSS2.

The sixth transistor T6 is turned on when as voltage of a third input signal [C(n+2)] is the gate-on voltage VGH to connect the first control node Q to the first buffer node Qh. The third input signal [C(n+2)] may be a carrier pulse outputted from a succeeding signal transmitter, for example, the $(n+2)^{th}$ signal transmitter [ST(n+2)], but is not limited thereto. The succeeding signal transmitter may be an $(n+1)^{th}$ signal transmitter [ST(n+1)]. The sixth transistor T6 includes a gate electrode to which the third input signal [C(n+2)] is applied, a first electrode connected to the first control node Q, and a second electrode connected to the first buffer node Qh.

The seventh transistor T7 is turned on when the voltage of the third input signal [C(n+2)] is the gate-on voltage VGH to connect the first buffer node Qh to the first VSS node GVSS2. The seventh transistor T7 includes a gate electrode to which the third input signal [C(n+2)] is applied, a first electrode connected to the first buffer node Qh, and a second electrode connected to the first VSS node GVSS2.

The eighth transistor T8 is turned on when the voltage of the second control node QB is the gate-on voltage VGH to connect the first control node Q to the first buffer node Qh. The eighth transistor T8 includes a gate electrode connected to the second control node QB, a first electrode connected to the first control node Q, and a second electrode connected to the first buffer node Qh.

The ninth transistor T9 is turned on when the voltage of the second control node QB is the gate-on voltage VGH to connect the first buffer node Qh to the first VSS node GVSS2. The ninth transistor T9 includes a gate electrode connected to the second control node QB, a first electrode connected to the first buffer node Qh, and a second electrode connected to the first VSS node GVSS2.

The tenth transistor T10 is turned on when the voltage of the first input signal [C(n−2)] is the gate-on voltage VGH to connect the second control node QB to the first VSS node GVSS2. The tenth transistor T10 includes a gate electrode to which the first input signal [C(n−2)] is applied, a first electrode connected to the second control node QB, and a second electrode connected to the first VSS node GVSS2.

The inverter circuit INV includes eleventh to fourteenth transistors T11 to T14 and a first capacitor C1.

When the eleventh transistor T11 is turned on, the second control node QB may be charged. When a voltage of a second buffer node NET1 is greater than a threshold voltage of the eleventh transistor T11, the eleventh transistor T11 is turned on. The first capacitor C1 is connected between the second buffer node NET1 and the second control node QB. At the same time as the eleventh transistor T11 is turned on, the voltage of the second buffer node NET1 is boosted to the voltage of the VDD node through the first capacitor C1. The first capacitor C1 may be formed between the first metal pattern LS1 and the second metal pattern LS2 as illustrated in FIGS. 11C, 11D, 12A, 12B, and 13B to 13E. The eleventh transistor T11 includes a gate electrode connected to the second buffer node NET1, a first electrode connected to the VDD node GVDD, and a second electrode connected to the second control node QB.

The twelfth transistor T12 includes a gate electrode and a first electrode connected to the VDD node GVDD, and a second electrode connected to the second buffer node NET1. The thirteenth transistor T13 includes a gate electrode connected to the first control node Q, a first electrode connected to the second buffer NET1, and a second electrode connected to a second VSS node GVSS1 to which the gate-off voltage VGL is applied. The fourteenth transistor T14 includes a gate electrode connected to the first control node Q, a first electrode connected to the second control node QB, and a second electrode connected to the first VSS node GVSS2.

The buffer BUF includes fifteenth to eighteenth transistors T15 to T18 and a second capacitor C2.

The fifteenth transistor T15 is a pull-up transistor that is turned on when the voltage of the first control node Q is boosted to the gate-on voltage VGH or higher and connects a first clock node to which a first shift clock [SCCLK(n)] is applied to a first output node, thereby charging the first output node. When the first output node is charged, the voltage of the gate pulse [Gout(n)] rises to the gate-on voltage VGH. The fifteenth transistor T15 includes a gate electrode connected to the first control node Q, a first electrode connected to the first clock node, and a second electrode connected to the first output node.

The second capacitor C2 is connected between the first control node Q and the first output node. The second capacitor C2 boosts the voltage of the first control node Q to the gate-on voltage VGH of the first shift clock [SCCLK(n)] when the fifteenth transistor T15 is turned on. The second capacitor C2 may be formed between the first metal pattern LS1 and the second metal pattern LS2 as illustrated in FIGS. 11C, 11D, 12A, 12B, and 13B to 13E.

The sixteenth transistor T16 is a pull-down transistor that is turned on when the voltage of the second control node QB is the gate-on voltage VGH to connect the first output node to a third VSS node GVSS0 to which the gate-off voltage VGL is applied. When the first output node is discharged, the voltage of the gate pulse [Gout(n)] is lowered to the gate-off voltage VGL. The sixteenth transistor T16 includes a gate electrode connected to the second control node QB, a first electrode connected to the first output node, and a second electrode connected to the third VSS node GVSS0.

The seventeenth transistor T17 is a pull-up transistor that is turned on when the voltage of the first control node Q is boosted to the gate-on voltage VGH or higher and connects a second clock node to which a second shift clock [(SC_CRCLK(n)] is applied to the second output node. The seventeenth transistor T17 includes a gate electrode connected to the first control node Q, a first electrode connected to the second clock node, and a second electrode connected to the second output node.

The eighteenth transistor T18 is a pull-down transistor that is turned on when the voltage of the second control node QB is the gate-on voltage VGH and connects the second output node to the first VSS node GVSS2, thereby discharging the second output node. The eighteenth transistor T18 includes a gate electrode connected to the second control node QB, a first electrode connected to the second output node, and a second electrode connected to the first VSS node GVSS2.

The transistors constituting the signal transmitter [ST(n)] shown in FIG. 15 may have different cross-sectional structures to be optimized for their respective functions. For example, the first, second, fourth, sixth, eighth, eleventh, twelfth, and fifteenth transistors T1, T2, T4, T6, T8, T11, T12, and T15 may be implemented as the transistor DGTR illustrated in FIGS. 13A to 13E. The third, fifth, seventh, ninth, sixteenth, seventeenth, and eighteenth transistors T3, T5, T7, T9, T16, T17, and T18 may be implemented as the transistor SCTR illustrated in FIGS. 11A to 11D. The tenth, thirteenth, and fourteenth transistors T10, T13, and T14 may be implemented as the transistor BGTR illustrated in FIGS. 12A to 12C.

Figure 16:
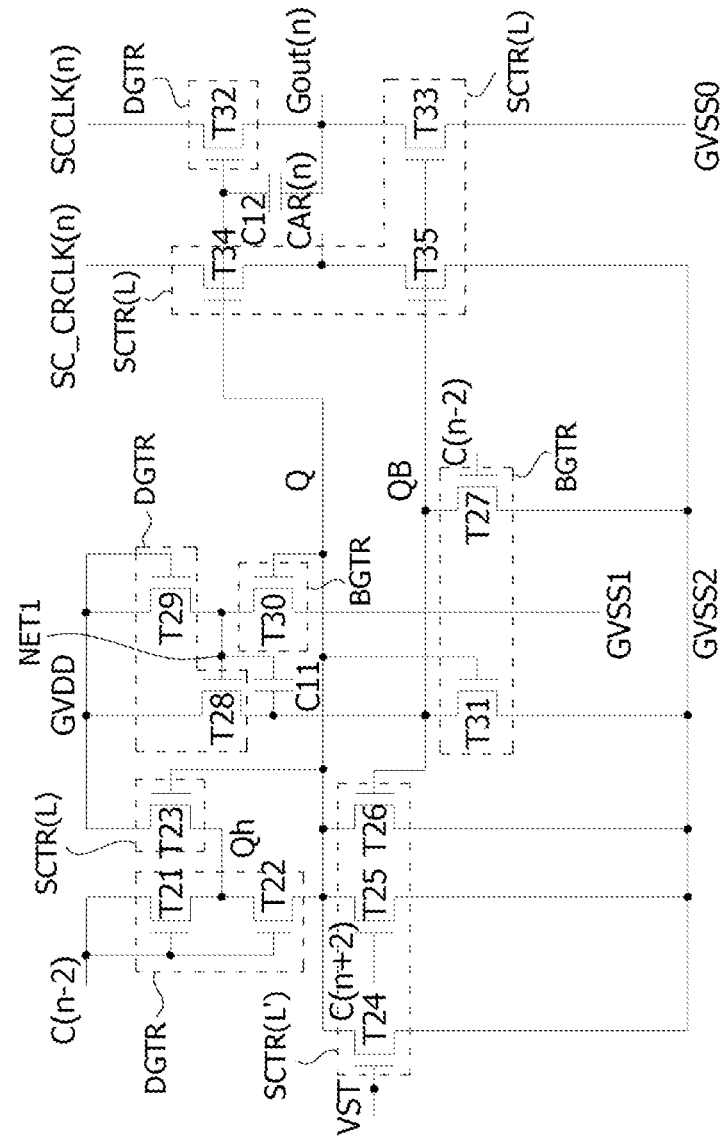
FIG. 16 is a circuit diagram illustrating in detail a signal transmitter according to a second embodiment of the present disclosure.

FIG. 16 is a circuit diagram illustrating in detail a signal transmitter according to a second embodiment of the present disclosure. FIG. 16 illustrates a circuit configuration of an $n^{th}$ signal transmitter [ST(n)]. The remainder of the signal transmitters other than the $n^{th}$ signal transmitter [ST(n)] have substantially the same circuit configuration as the $n^{th}$ signal transmitter [ST(n)].

Referring to FIG. 16, a control circuit CTRL may include first to seventh transistors T21 to T27.

The signal transmitters include power nodes to which a constant voltage is applied, for example, a VDD node GVDD to which the gate-on voltage VGH is applied and VSS nodes GVSS0, GVSS1, and GVSS2 to which the gate-off voltage VGL is applied. The gate-off voltage VGL having the same voltage level or a gate-off voltage VGL having different voltage levels may be applied to the VSS nodes GVSS0, GVSS1, and GVSS2.

The first transistor T21 includes a gate electrode and a first electrode to which the first input signal [C(n−2)] is applied, and a second electrode connected to the buffer node Qh. The second transistor T22 includes a gate electrode to which the first input signal [C(n−2)] is applied, a first electrode connected to the first buffer node Qh, and a second electrode connected to the first control node Q. The third transistor T23 includes a gate electrode connected to the first control node Q, a first electrode connected to the VDD node GVDD, and a second electrode connected to the first buffer node Qh.

The fourth transistor T24 includes a gate electrode to which the second input signal VST is applied, a first electrode connected to the first control node Q, and a second electrode connected to a first VSS node GVSS2. The fifth transistor T25 includes a gate electrode to which the third input signal [C(n+2)] is applied, a first electrode connected to the first control node Q, and a second electrode connected to the first VSS node GVSS2. The sixth transistor T26 includes a gate electrode connected to the second control node QB, a first electrode connected to the first control node Q, and a second electrode connected to the first VSS node GVSS2. The seventh transistor T27 includes a gate electrode to which the first input signal [C(n−2)] is applied, a first electrode connected to the second control node QB, and a second electrode connected to the first VSS node GVSS2.

An inverter circuit INV includes eighth to eleventh transistors T28 to T31 and a first capacitor C11.

The eighth transistor T28 includes a gate electrode connected to a second buffer node NET1, a first electrode connected to a VDD node GVDD, and a second electrode connected to a second control node QB. The first capacitor C11 is connected between the second buffer node NET1 and the second control node QB. The first capacitor C11 may be formed between the first metal pattern LS1 and the second metal pattern LS2.

The ninth transistor T29 includes a gate electrode and a first electrode connected to the VDD node GVDD, and a second electrode connected to the second buffer node NET1. The tenth transistor T30 includes a gate electrode connected to the first control node Q, a first electrode connected to the second buffer node NET1, and a second electrode connected to the second VSS node GVSS1. The eleventh transistor T31 includes a gate electrode connected to the first control node Q, a first electrode connected to the second control node QB, and a second electrode connected to the first VSS node GVSS2.

A buffer BUF includes twelfth to fifteenth transistors T32 to T35 and a second capacitor C12.

The twelfth transistor T32 includes a gate electrode connected to the first control node Q, a first electrode connected to a first clock node to which a first shift clock [SCCLK(N)] is applied, and a second electrode connected to the first output node. The second capacitor C12 is connected between the first control node Q and the first output node. The second capacitor C12 may be formed between the first metal pattern LS1 and the second metal pattern LS2. The thirteenth transistor T33 includes a gate electrode connected to the second control node QB, a first electrode connected to the first output node, and a second electrode connected to a third VSS node GVSS0. The fourteenth transistor T34 includes a gate electrode connected to the first control node Q, a first electrode connected to a second clock node to which a second shift clock [SC_CRCLK(n)] is applied, and a second electrode connected to the second output node. The fifteenth transistor T35 includes a gate electrode connected to the second control node QB, a first electrode connected to the second output node, and a second electrode connected to the first VSS node GVSS2.

The transistors constituting the signal transmitter [ST(n)] illustrated in FIG. 16 may have different cross-sectional structures to be optimized for their respective functions. For example, the first, second, eighth, ninth, and twelfth transistors T21, T22, T28, T29, and T32 may be implemented as the transistor DGTR illustrated in FIGS. 13A to 13E. The third, thirteenth, fourteenth, and fifteenth transistors T23, T33, T34, and T35 may be implemented as the transistor SCTR (L) illustrated in FIGS. 11A to 11D. The fourth, fifth, and sixth transistors T24, T25, and T26 are implemented as the transistor illustrated in FIGS. 11A to 11D, but they may be preferably implemented as the transistor SCTR (L') having a longer channel length L' than the first, second, eighth, ninth, and twelfth transistors T21, T22, T28, T29, and T32. The sixth, seventh, and tenth transistors T26, T27, and T30 may be implemented as the transistor BGTR illustrated in FIGS. 12A to 12C.

Figure 17:
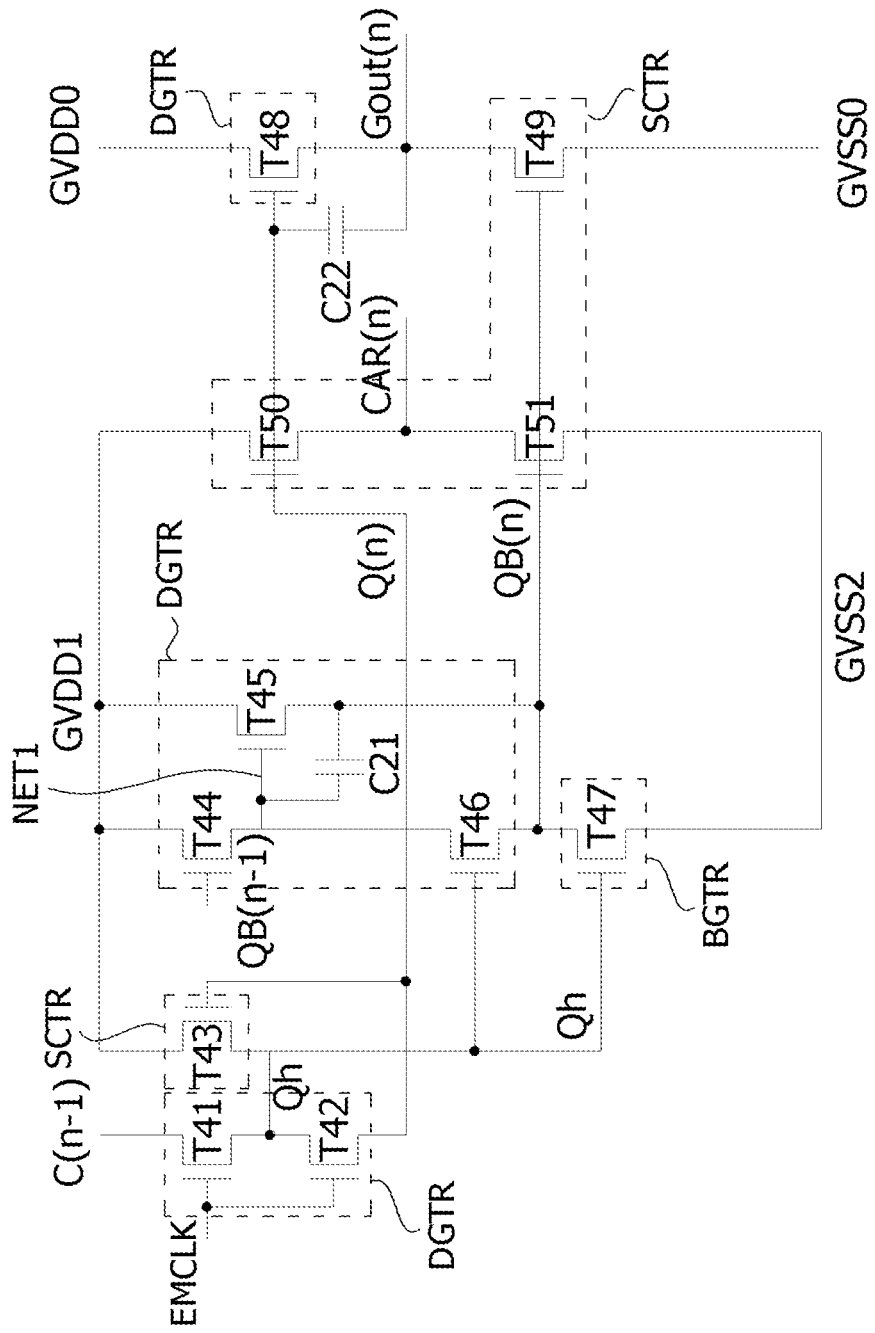
FIG. 17 is a circuit diagram illustrating in detail a signal transmitter according to a third embodiment of the present disclosure.

FIG. 17 is a circuit diagram illustrating in detail a signal transmitter according to a third embodiment of the present disclosure. FIG. 17 illustrates a circuit configuration of an $n^{th}$ signal transmitter [ST(n)]. The remainder of the signal transmitters other than the $n^{th}$ signal transmitter [ST(n)] have substantially the same circuit configuration as the $n^{th}$ signal transmitter [ST(n)]. In FIG. 17, 'Q(n)' and 'QB(n)' denote first and second control nodes of the $n^{th}$ signal transmitter [ST(n)], respectively, and 'Gout(n)' and 'CAR(n)' denote a gate pulse and a carry pulse outputted from the $n^{th}$ signal transmitter [ST(n)], respectively.

Referring to FIG. 17, a control circuit CTRL may include first to seventh transistors T41 to T47, and a first capacitor C21.

The signal transmitters include power nodes to which a constant voltage is applied, for example, VDD nodes GVDD0 and GVDD1 to which the gate-on voltage VGH is applied and VSS nodes GVSS0 and GVSS2 to which the gate-off voltage VGL is applied. The gate-off voltage VGL having the same voltage level or the gate-off voltage VGL having different voltage levels may be applied to the VDD nodes GVDD0 and GVDD1. The gate-off voltage VGL having the same voltage level or the gate-off voltage VGL having different voltage levels may be applied to the VSS nodes GVSS0 and GVSS2.

The first transistor T41 includes a gate electrode to which a second input signal EMCLK is applied, a first electrode to which a first input signal [C(n−1)] is applied, and a second electrode connected to a first buffer node Qh. The first input signal [C(n−1)] may be a start pulse or a carry pulse outputted from a preceding signal transmitter. The second input signal EMCLK may be a shift clock. Such a shift clock may be a shift clock synchronized with a gate signal, for example, an EM pulse, but is not limited thereto.

The second transistor T42 includes a gate electrode to which the second input signal EMCLK is applied, a first electrode connected to a first buffer node Qh, and a second electrode connected to the first control node Q(n). The third transistor T43 includes a gate electrode connected to the first control node Q(n), a first electrode connected to a first VDD node GVDD1 to which the gate-on voltage VGH is applied, and a second electrode connected to the first buffer node Qh.

The fourth transistor T44 includes a gate electrode to which a third input signal [QB(n−1)] is applied, a first electrode connected to the first VDD node GVDD1, and a second electrode connected to a second buffer node NET1. The third input signal [QB(n−1)] may be a voltage of a second control node QB(n) in a preceding signal transmitter, for example, an $(n-1)^{th}$ signal transmitter [ST(n−1)].

The fifth transistor T45 includes a gate electrode connected to a second buffer node NET1, a first electrode connected to the first VDD node GVDD1, and a second electrode connected to the second control node QB(n). The first capacitor C21 is connected between the second buffer node NET1 and the second control node QB(n). The first capacitor C21 may be formed between the first metal pattern LS1 and the second metal pattern LS2.

The sixth transistor T46 includes a gate electrode connected to the first buffer node Qh, a first electrode connected to the second buffer node NET1, and a second electrode connected to the second control node QB(n). The seventh transistor T47 includes a gate electrode connected to the first buffer node Qh, a first electrode connected to the second control node QB(n), and a second electrode connected to a first VSS node GVSS2.

A buffer BUF includes eighth to eleventh transistors T48 to T51 and a second capacitor C22.

The eighth transistor T48 includes a gate electrode connected to the first control node Q(n), a first electrode connected to the second VDD node GVDD0 to which the gate-on voltage VGH is applied, and a second electrode connected to a first output node. The second capacitor C22 is connected between the first control node Q(n) and the first output node. The second capacitor C22 may be formed between the first metal pattern LS1 and the second metal pattern LS2. The ninth transistor T49 includes a gate electrode connected to the second control node QB(n), a first electrode connected to the first output node, and a second electrode connected to a second VSS node GVSS0. The tenth transistor T50 includes a gate electrode connected to the first control node Q(n), a first electrode connected to a first VDD node GVDD1, and a second electrode connected to the second output node. The eleventh transistor T51 includes a gate electrode connected to the second control node QB(n), a first electrode connected to the second output node, and a second electrode connected to a first VSS node GVSS2.

The transistors constituting the signal transmitter [ST(n)] illustrated in FIG. 17 may have different cross-sectional structures to be optimized for their respective functions. For example, the first, second, fourth, fifth, sixth, and eighth transistors T41, T42, T44, T45, T46, and T48 may be implemented as the transistor DGTR illustrated in FIGS. 13A to 13E. The third, ninth, tenth, and eleventh transistors T43, T49, T50, and T51 may be implemented as the transistor SCTR illustrated in FIGS. 11A to 11D. The seventh transistor T47 may be implemented as the transistor BGTR illustrated in FIGS. 12A to 12C.

The display device of the present disclosure may select pixel lines by using a line selection pulse by which a start gate pulse is generated according to a preset sequence. The signal transmitters [ST(n−1) to ST(n+2)] in the gate driver 120 may include a pixel line selection circuit that outputs the gate pulse in response to the line selection pulse even when a start pulse or a carry pulse is not inputted thereto.

The pixel line selection circuit may be applied to various driving methods. As an example, in a method of real-time sensing the electrical characteristics of the driving elements in each of sub-pixels using an external compensation circuit, it is possible to sense the electrical characteristics of the driving elements disposed in the sub-pixels in one or n pixel lines (where n is a positive integer greater than 0) by selecting the pixel lines from predetermined pixel lines every frame period. For example, a sensing gate pulse is applied to sub-pixels in a tenth pixel line in a first frame period, and then the sensing gate pulse may be applied to sub-pixels in an eleventh pixel line in a second frame period.

Figure 18:
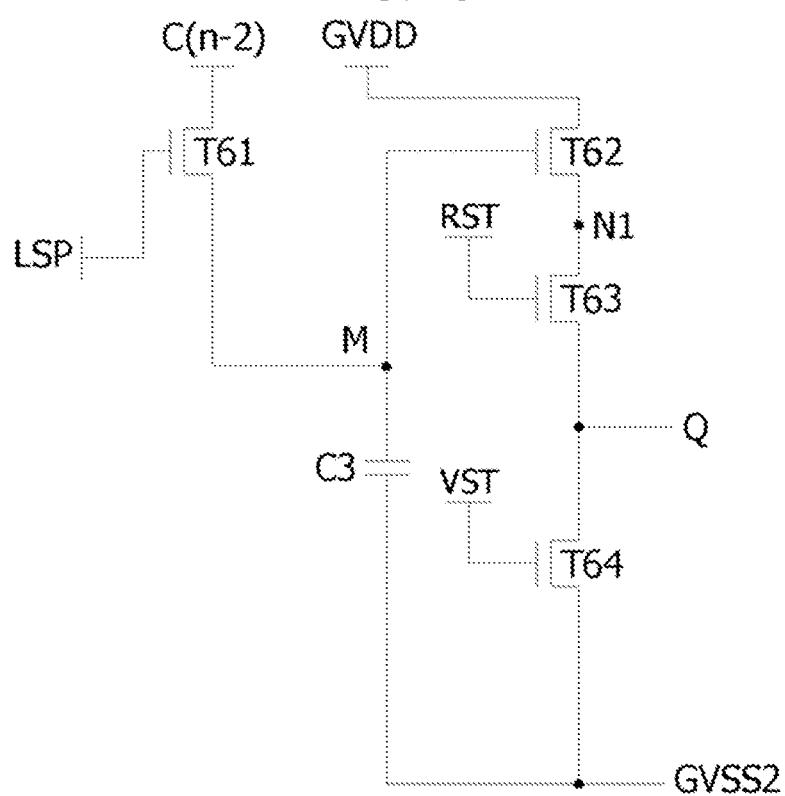
FIG. 18 is a diagram illustrating an example of a pixel line selection circuit.

FIG. 18 is a diagram illustrating an example of a pixel line selection circuit.

Referring to FIG. 18, a control circuit in at least one of the signal transmitters [ST(n−1) to ST(n+2)] may include a pixel line selection circuit. The pixel line selection circuit is applicable to the signal transmitter shown in FIGS. 15 to 17 or a well-known signal transmitter circuit.

The pixel line selection circuit includes at least first to fourth transistors T61 to T64 and a capacitor C3.

In a method of sensing electrical characteristics of driving elements, a line selection pulse LSP may be inputted to a signal transmitter that drives gate lines in a pixel line to be sensed. The line selection pulse LSP may be generated once or n times at a vertical blank time with no pixel data in one frame period according to a sequence set by the timing controller 130. The signal transmitter to which the line selection pulse LSP is inputted applies a sensing gate pulse to a gate line connected to sub-pixels in a pixel line to be sensed in response to the line selection pulse LSP.

When the line selection pulse LSP is generated at the vertical blank time, a first node M is charged and the second transistor T62 is turned on. At this time, when a reset pulse RST is generated from the timing controller 130, the third transistor T63 is turned on to charge the first control node Q and outputs it through the buffer BUF. Immediately after the vertical blank time is over, a start pulse VST and the line selection pulse LSP are generated at the start of the next frame period, and nodes M and Q are initialized.

The first transistor T61 is turned on in response to the line selection pulse LSP of the gate-on voltage VGH. The first transistor T61 includes a gate electrode to which the line selection pulse LSP is applied, a first electrode to which a first input signal [C(n−2)] is applied, and a second electrode connected to the first node M. The first input signal may be a carriy pulse outputted from a preceding signal transmitter, for example, the $(n-2)^{th}$ signal transmitter [ST(n−2)], but is not limited thereto.

The capacitor C3 is connected between the first node M and a VSS node GVSS2. The capacitor C3 may be formed between the first metal pattern LS1 and the second metal pattern LS2.

The second transistor T62 is turned on when a voltage of the first node M is charged to the gate-on voltage VGH to connect a VDD node GVDD to a second node N1. The second transistor T52 includes a gate electrode connected to the first node M, a first electrode connected to the VDD node GVDD to which the gate-on voltage VGH is applied, and a second electrode connected to the second node N1.

The third transistor T63 is turned on in response to a reset pulse RST of the gate-on voltage VGH to connect the second node N1 to the first control node Q. The third transistor T63 includes a gate electrode to which the reset pulse RST is applied, a first electrode connected to the second node N1, and a second electrode connected to the first control node Q.

The fourth transistor T64 is turned on in response to the start pulse VST of the gate-on voltage VGH to connect the first control node Q to the VSS node GVSS2. The fourth transistor T64 includes a gate electrode to which the start pulse VST is applied, a first electrode connected to the first control node Q, and a second electrode connected to the first VSS node GVSS2.

The transistors constituting the line selection circuit shown in FIG. 18 may have different cross-sectional structures to be optimized for their respective functions. For example, the first, second and third transistors T61, T62, and T63 may be implemented as the transistor DGTR illustrated in FIGS. 13A to 13E. The fourth transistor T64 may be implemented as the transistor SCTR illustrated in FIGS. 11A to 11D.

The disclosure comprises the following items:

A display panel comprises a circuit layer disposed on a substrate and including a plurality of transistors; a light emitting element layer disposed on the circuit layer and including a plurality of light emitting elements; and an encapsulation layer configured to cover the light emitting element layer. The circuit layer includes at least a first transistor and a second transistor. The first transistor includes a first oxide semiconductor pattern, a gate electrode overlapping the first oxide semiconductor pattern above the first oxide semiconductor pattern, a first electrode in contact with one side of the first oxide semiconductor pattern on the first oxide semiconductor pattern, a second electrode in contact with the other side of the first oxide semiconductor pattern on the first oxide semiconductor pattern, and a first-first metal pattern disposed on the substrate to overlap the first oxide semiconductor pattern. The second transistor includes a second oxide semiconductor pattern, a gate electrode overlapping the second oxide semiconductor pattern above the second oxide semiconductor pattern, a first electrode in contact with one side of the second oxide semiconductor pattern, a second electrode in contact with the other side of the second oxide semiconductor pattern, a first-second metal pattern disposed on the substrate to overlap the second oxide semiconductor pattern, and a second metal pattern disposed between the second oxide semiconductor pattern and the first-second metal pattern. All transistors in the circuit layer may be n-channel oxide transistors.

The first-first metal pattern is disposed under the first oxide semiconductor pattern, and the first-second metal pattern is disposed under the second oxide semiconductor pattern.

The display panel further comprises a fifth metal layer disposed above the first and second transistors. The fifth metal layer includes a fifth-first metal pattern disposed on the first transistor; a fifth-second metal pattern disposed on the second transistor; and a fifth-third metal pattern configured to connect anode electrodes of the light emitting elements to the second electrode of the second transistor.

The fifth metal layer may include titanium.

The first and second electrodes of the first and second transistors may include titanium.

The display panel further comprises a first insulating layer disposed on the substrate to cover the first-first and first-second metal patterns; a second insulating layer disposed on the first insulating layer to cover the second metal pattern and the first insulating layer; a third insulating layer disposed on the second insulating layer to cover the first and second oxide semiconductor patterns and the second insulating layer; a fourth insulating layer disposed on the third insulating layer to cover the gate electrodes of the first and second transistors and the third insulating layer; a fifth insulating layer disposed on the fourth insulating layer to cover the first and second electrodes of the first and second transistors and the fourth insulating layer; and a sixth insulating layer disposed on the fifth insulating layer to cover the fifth metal layer and the fifth insulating layer. Each of the first to fourth insulating layers is an inorganic film. Each of the fifth and sixth insulating layers is an organic film having a thickness greater than that of each of the first to fourth insulating layers.

The first insulating layer has a thickness of 500 Å to 3000 Å.

The circuit layer includes pixels connected to data lines through which a data voltage is applied, gate lines through which a gate pulse is applied, and power lines through which a constant voltage is applied; and a gate driver configured to generate the gate pulse. Each of the pixels includes a pixel circuit. The pixel circuit includes a driving element configured to drive the light emitting element; and a switch element configured to be turned on/off in response to the gate pulse. The gate driver includes a plurality of transistors. The driving element, the switch element, and the transistors of the gate driver, are the n-channel oxide transistors.

The switch element has the same stacked structure as that of the first transistor.

The second electrode of the first transistor is in contact with the first-first metal pattern.

The driving element has the same stacked structure as that of the second transistor.

The second electrode of the second transistor is in contact with the second metal pattern.

The display panel further comprises a jumping pattern disposed on the same layer as that of the first and second electrodes of the first and second transistors, and configured to be in contact with a conductive semiconductor pattern through a contact hole penetrating the third and fourth insulating layers, and to be in contact with the first-second metal pattern through a contact hole penetrating the first to fourth insulating layers.

At least a part of the gate driver is disposed in a bezel area outside a pixel array in which the pixels are arranged in the display panel. The circuit layer further includes a plurality of VSS lines disposed in the pixel array and through which a pixel reference voltage is applied; and a shorting bar configured to connect the VSS lines.

The circuit layer further includes a closed-loop electrostatic discharge wire disposed in the bezel area; a plurality of electrostatic discharge elements connected between the data lines and the electrostatic discharge wire; and a plurality of electrostatic discharge elements connected between the gate lines and the electrostatic discharge wire. The electrostatic discharge elements have the same stacked structure as that of the first transistor.

The circuit layer further includes a demultiplexer connected to the data lines, and switch elements of the demultiplexer have the same stacked structure as that of the first transistor.

The circuit layer includes a gate driver including a shift register. Each of signal transmitters in the shift register includes a first control node, a second control node, and a control circuit configured to charge and discharge the first and second control nodes in response to input signals; and a buffer configured to output a gate pulse to a first output node and to output a carry pulse to a second output node. At least one of the control circuit and the buffer includes at least two or more transistors having different cross-sectional structures.

The control circuit includes a transistor including a gate electrode connected to the second control node, a first electrode connected to the first control node, and a second electrode connected to a first buffer node; and a transistor including a gate electrode connected to the second control node, a first electrode connected to the first buffer node, and a second electrode connected to a VSS node.

Each of the signal transmitters further includes an inverter circuit configured to cause the second control node to discharge when the first control node is charged and to cause the second control node to charge when the first control node is discharged. The inverter circuit includes a transistor including a gate electrode connected to a second buffer node, a first electrode connected to a VDD node, and a second electrode connected to the second control node; a transistor including a gate electrode and a first electrode connected to the VDD node, and a second electrode connected to the second buffer node; a transistor including a gate electrode connected to the first control node, a first electrode connected to the second buffer node, and a second electrode connected to a second VSS node; and a transistor including a gate electrode connected to the first control node, a first electrode connected to the second control node, and a second electrode connected to a first VSS node.

The control circuit includes a transistor including a gate electrode to which a line selection pulse is applied, a first electrode to which an input signal is applied, and a second electrode connected to a first node; a capacitor coupled between the first node and a VSS node; a transistor including a gate electrode connected to the first node, a first electrode connected to a VDD node, and a second electrode connected to a second node; a transistor including a gate electrode to which a reset pulse is applied, a first electrode connected to the second node, and a second electrode connected to the first control node; and a transistor including a gate electrode to which a start pulse is applied, a first electrode connected to the first control node, and a second electrode connected to the VSS node.

A display panel comprising a circuit layer disposed on a substrate and including a plurality of transistors; a light emitting element layer disposed on the circuit layer and including a plurality of light emitting elements; and an encapsulation layer configured to cover the light emitting element layer. The circuit layer includes at least a first transistor and a second transistor. The first transistor includes: a first oxide semiconductor pattern, a gate electrode overlapping the first oxide semiconductor pattern above the first oxide semiconductor pattern, a first electrode in contact with one side of the first oxide semiconductor pattern, and a second electrode in contact with the other side of the first oxide semiconductor pattern. The second transistor includes a second oxide semiconductor pattern, a gate electrode overlapping the second oxide semiconductor pattern above the second oxide semiconductor pattern, a first electrode in contact with one side of the second oxide semiconductor pattern, a second electrode in contact with the other side of the second oxide semiconductor pattern, a first metal pattern disposed on the substrate to overlap the second oxide semiconductor pattern, and a second metal pattern disposed between the second oxide semiconductor pattern and the first metal pattern. All transistors in the circuit layer may be n-channel oxide transistors.

The first metal pattern is disposed under the second oxide semiconductor pattern.

The circuit layer includes a gate driver including a shift register. Each of signal transmitters in the shift register includes a first control node, a second control node, and a control circuit configured to charge and discharge the first and second control nodes in response to input signals; and a buffer configured to output a gate pulse to a first output node and to output a carry pulse to a second output node. At least one of the control circuit and the buffer includes at least two transistors of a transistor having a source contact structure, a transistor having a back gate, and a transistor having a double gate. The transistor having a source contact structure includes a gate electrode, a first oxide semiconductor pattern, a first electrode in contact with one side of the first oxide semiconductor pattern, a second electrode in contact with the other side of the first oxide semiconductor pattern, and a metal pattern disposed under the first oxide semiconductor pattern and configured to be in contact with the second electrode. The transistor having a back gate includes a gate electrode, a second oxide semiconductor pattern, a first electrode in contact with one side of the second oxide semiconductor pattern, a second electrode in contact with the other side of the second oxide semiconductor pattern, and a metal pattern disposed under the second oxide semiconductor pattern and to which a constant voltage is applied. The transistor having a double gate includes a gate electrode, a third oxide semiconductor pattern, a first electrode in contact with one side of the third oxide semiconductor pattern, a second electrode in contact with the other side of the third oxide semiconductor pattern, and a metal pattern disposed under the third oxide semiconductor pattern and configured to be in contact with the gate electrode.

The control circuit includes a transistor including a gate electrode connected to the second control node, a first electrode connected to the first control node, and a second electrode connected to a first buffer node; and a transistor including a gate electrode connected to the second control node, a first electrode connected to the first buffer node, and a second electrode connected to a VSS node.

Each of the signal transmitters further includes an inverter circuit configured to cause the second control node to discharge when the first control node is charged and to cause the second control node to charge when the first control node is discharged. The inverter circuit includes a transistor including a gate electrode connected to a second buffer node, a first electrode connected to a VDD node, and a second electrode connected to the second control node; a transistor including a gate electrode and a first electrode connected to the VDD node, and a second electrode connected to the second buffer node; a transistor including a gate electrode connected to the first control node, a first electrode connected to the second buffer node, and a second electrode connected to a second VSS node; and a transistor including a gate electrode connected to the first control node, a first electrode connected to the second control node, and a second electrode connected to a first VSS node.

The control circuit includes a transistor including a gate electrode to which a line selection pulse is applied, a first electrode to which an input signal is applied, and a second electrode connected to a first node; a capacitor coupled between the first node and a VSS node; a transistor including a gate electrode connected to the first node, a first electrode connected to a VDD node, and a second electrode connected to a second node; a transistor including a gate electrode to which a reset pulse is applied, a first electrode connected to the second node, and a second electrode connected to the first control node; and a transistor including a gate electrode to which a start pulse is applied, a first electrode connected to the first control node, and a second electrode connected to the VSS node.

A display panel comprises a circuit layer disposed on a substrate and including a plurality of transistors; a light emitting element layer disposed on the circuit layer and including a plurality of light emitting elements; and an encapsulation layer covering the light emitting element layer. The circuit layer includes a gate driver including a shift register. Each of signal transmitters in the shift register includes a transistor having a source contact structure, the transistor including a gate electrode, a first oxide semiconductor pattern, a first electrode in contact with one side of the first oxide semiconductor pattern, a second electrode in contact with the other side of the first oxide semiconductor pattern, and a metal pattern disposed under the first oxide semiconductor pattern and configured to be in contact with the second electrode; a transistor having a back gate, the transistor including a gate electrode, a second oxide semiconductor pattern, a first electrode in contact with one side of the second oxide semiconductor pattern, a second electrode in contact with the other side of the second oxide semiconductor pattern, and a metal pattern disposed under the second oxide semiconductor pattern and to which a constant voltage is applied; and a transistor having a double gate, the transistor including a gate electrode, a third oxide semiconductor pattern, a first electrode in contact with one side of the third oxide semiconductor pattern, a second electrode in contact with the other side of the third oxide semiconductor pattern, and a metal pattern disposed under the third oxide semiconductor pattern and configured to be in contact with the gate electrode. All transistors in the circuit layer may be n-channel oxide transistors.

The metal pattern includes one or more of a first metal pattern in which at least a portion thereof overlaps an oxide semiconductor pattern with a first insulating layer and a second insulating layer interposed therebetween, and a second metal pattern in which at least a portion thereof overlaps the oxide semiconductor pattern with the second insulating layer interposed therebetween.

An electronic device comprising a display device on which an input image is reproduced; and a host system that transmits pixel data of an input image to the display device. The display device includes the display panel having the structure as described above.

It is to be understood that both the foregoing general description and the following detailed description of the present disclosure are example and explanatory and are not intended to specify essential limitations recited in the claims. Therefore, the scope of the claims is not restricted by the foregoing general description and the following detailed description of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. All the technical concepts disclosed and its equivalents should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
 a circuit layer disposed on a substrate and including a plurality of transistors;
 a light emitting element layer disposed on the circuit layer and including a plurality of light emitting elements; and
 an encapsulation layer on the light emitting element layer,
 wherein the circuit layer includes a first transistor and a second transistor,
 wherein the first transistor includes:
  a first oxide semiconductor pattern,
  a gate electrode overlapping the first oxide semiconductor pattern above the first oxide semiconductor pattern,
  a first electrode in contact with one side of the first oxide semiconductor pattern on the first oxide semiconductor pattern, and a second electrode in contact with the other side of the first oxide semiconductor pattern on the first oxide semiconductor pattern, and wherein the second transistor includes:
a second oxide semiconductor pattern,
a gate electrode overlapping the second oxide semiconductor pattern above the second oxide semiconductor pattern,
a first electrode in contact with one side of the second oxide semiconductor pattern, and
a second electrode in contact with the other side of the second oxide semiconductor pattern, wherein the circuit layer includes a first-first metal pattern disposed on the substrate to overlap the first oxide semiconductor pattern, a first-second metal pattern disposed on the substrate to overlap the second oxide semiconductor pattern, and a second metal pattern disposed between the second oxide semiconductor pattern and the first-second metal pattern, wherein the first and second electrodes of the first transistor do not overlap with the first-second metal pattern from a cross-sectional view, wherein the second electrode of the first transistor extends toward the substrate and contacts the first-first metal pattern.

2. The display panel of claim 1, further comprising:
a fifth metal layer disposed above the first and second transistors,
wherein the fifth metal layer includes:
a fifth-first metal pattern disposed on the first transistor;
a fifth-second metal pattern disposed on the second transistor; and
a fifth-third metal pattern coupled to anode electrodes of the light emitting elements and the second electrode of the second transistor,
wherein the fifth metal layer includes titanium.

3. The display panel of claim 2, wherein the first and second electrodes of the first and second transistors include titanium.

4. The display panel of claim 2, further comprising:
a first insulating layer disposed on the substrate covering the first-first and first-second metal patterns;
a second insulating layer disposed on the first insulating layer covering the second metal pattern and the first insulating layer;
a third insulating layer disposed on the second insulating layer covering the first and second oxide semiconductor patterns and the second insulating layer;
a fourth insulating layer disposed on the third insulating layer covering the gate electrodes of the first and second transistors and the third insulating layer;
a fifth insulating layer disposed on the fourth insulating layer covering the first and second electrodes of the first and second transistors and the fourth insulating layer; and
a sixth insulating layer disposed on the fifth insulating layer covering the fifth metal layer and the fifth insulating layer, wherein
each of the first to fourth insulating layers is an inorganic film,
each of the fifth and sixth insulating layers is an organic film having a thickness greater than that of each of the first to fourth insulating layers, wherein the first insulating layer has a thickness of 500 Å to 3000 Å.

5. The display panel of claim 1, wherein the circuit layer includes:
pixels coupled to data lines through which a data voltage is applied, gate lines through which a gate pulse is applied, and power lines through which a constant voltage is applied; and
a gate driver configured to generate the gate pulse,
wherein each of the pixels includes a pixel circuit,
wherein the pixel circuit includes:
a driving element configured to drive the light emitting element; and
a switch element configured to be turned on/off in response to the gate pulse,
wherein the gate driver includes a plurality of transistors, and
wherein the driving element, the switch element, and the transistors of the gate driver, are n-channel oxide transistors.

6. The display panel of claim 5, wherein the switch element has a same stacked structure as that of the first transistor.

7. The display panel of claim 5, wherein the second electrode of the first transistor is in contact with the first-first metal pattern.

8. The display panel of claim 5, wherein the driving element has a same stacked structure as that of the second transistor.

9. The display panel of claim 5, further comprising:
a jumping pattern disposed on a same layer as that of the first and second electrodes of the first and second transistors, and configured to be in contact with a conductive semiconductor pattern through a contact hole penetrating third and fourth insulating layers, and to be in contact with the first-second metal pattern through a contact hole penetrating the first to fourth insulating layers.

10. The display panel of claim 1, wherein the second electrode of the second transistor is in contact with the second metal pattern.

11. The display panel of claim 1, wherein the circuit layer includes a gate driver including a shift register,
each of signal transmitters in the shift register includes:
a first control node, a second control node, and a control circuit configured to charge and discharge the first and second control nodes in response to input signals; and
a buffer configured to output a gate pulse to a first output node and to output a carry pulse to a second output node, and
wherein at least one of the control circuit and the buffer includes at least two or more transistors having different cross-sectional structures.

12. The display panel of claim 11, wherein the control circuit includes:
a transistor including a gate electrode coupled to the second control node, a first electrode coupled to the first control node, and a second electrode coupled to a first buffer node; and
a transistor including a gate electrode coupled to the second control node, a first electrode coupled to the first buffer node, and a second electrode coupled to a VSS node.

13. The display panel of claim 11, wherein each of the signal transmitters further includes:
an inverter circuit configured to cause the second control node to discharge when the first control node is charged and to cause the second control node to charge when the first control node is discharged, and wherein the inverter circuit includes:
a transistor including a gate electrode coupled to a second buffer node, a first electrode coupled to a VDD node, and a second electrode coupled to the second control node;
a transistor including a gate electrode and a first electrode coupled to the VDD node, and a second electrode coupled to the second buffer node;
a transistor including a gate electrode coupled to the first control node, a first electrode coupled to the second buffer node, and a second electrode coupled to a second VSS node; and
a transistor including a gate electrode coupled to the first control node, a first electrode coupled to the second control node, and a second electrode coupled to a first VSS node.

14. The display panel of claim 11, wherein the control circuit includes:
a transistor including a gate electrode to which a line selection pulse is applied, a first electrode to which an input signal is applied, and a second electrode coupled to a first node;
a capacitor coupled between the first node and a VSS node;
a transistor including a gate electrode coupled to the first node, a first electrode coupled to a VDD node, and a second electrode coupled to a second node;
a transistor including a gate electrode to which a reset pulse is applied, a first electrode coupled to the second node, and a second electrode coupled to the first control node; and
a transistor including a gate electrode to which a start pulse is applied, a first electrode coupled to the first control node, and a second electrode coupled to the VSS node.

15. The display panel of claim 1, wherein the second electrode of the second transistor is in contact with the second metal pattern.

16. A display panel comprising:
a circuit layer disposed on a substrate and including a plurality of transistors;
a light emitting element layer disposed on the circuit layer and including a plurality of light emitting elements; and
an encapsulation layer on the light emitting element layer,
wherein the circuit layer includes at least a first transistor and a second transistor,
wherein the first transistor includes:
a first oxide semiconductor pattern,
a gate electrode overlapping the first oxide semiconductor pattern above the first oxide semiconductor pattern,
a first electrode in contact with one side of the first oxide semiconductor pattern, and
a second electrode in contact with the other side of the first oxide semiconductor pattern, and
wherein the second transistor includes:
a second oxide semiconductor pattern,
a gate electrode overlapping the second oxide semiconductor pattern above the second oxide semiconductor pattern,
a first electrode in contact with one side of the second oxide semiconductor pattern,
a second electrode in contact with the other side of the second oxide semiconductor pattern, wherein the circuit layer includes a third oxide semiconductor pattern adjacent to and spaced apart from the second oxide semiconductor pattern,
wherein the circuit layer includes a first metal pattern disposed on the substrate to overlap the second oxide semiconductor pattern, and a second metal pattern disposed between the second oxide semiconductor pattern and the first metal pattern, and
wherein the second electrode of the second transistor extends between the second and third oxide semiconductor patterns and contacts the second metal pattern.

17. The display panel of claim 16, wherein the circuit layer includes:
a gate driver including a shift register,
each of signal transmitters in the shift register includes:
a first control node, a second control node, and a control circuit configured to charge and discharge the first and second control nodes in response to input signals; and
a buffer configured to output a gate pulse to a first output node and to output a carry pulse to a second output node,
at least one of the control circuit and the buffer includes at least two transistors of a transistor having a source contact structure, a transistor having a back gate, and a transistor having a double gate,
the transistor having Ta source contact structure includes a gate electrode, a first oxide semiconductor pattern, a first electrode in contact with one side of the first oxide semiconductor pattern, a second electrode in contact with the other side of the first oxide semiconductor pattern, and a metal pattern disposed under the first oxide semiconductor pattern and configured to be in contact with the second electrode,
the transistor having a back gate includes a gate electrode, a second oxide semiconductor pattern, a first electrode in contact with one side of the second oxide semiconductor pattern, a second electrode in contact with the other side of the second oxide semiconductor pattern, and a metal pattern disposed under the second oxide semiconductor pattern and to which a constant voltage is applied,
the transistor having a double gate includes a gate electrode, a third oxide semiconductor pattern, a first electrode in contact with one side of the third oxide semiconductor pattern, a second electrode in contact with the other side of the third oxide semiconductor pattern, and a metal pattern disposed under the third oxide semiconductor pattern and configured to be in contact with the gate electrode.

18. The display panel of claim 16, wherein the control circuit includes:
a transistor including a gate electrode coupled to the second control node, a first electrode coupled to the first control node, and a second electrode coupled to a first buffer node; and
a transistor including a gate electrode coupled to the second control node, a first electrode coupled to the first buffer node, and a second electrode coupled to a VSS node.

19. The display panel of claim 16, wherein each of the signal transmitters further includes:
an inverter circuit configured to cause the second control node to discharge when the first control node is charged and to cause the second control node to charge when the first control node is discharged,
wherein the inverter circuit includes:
a transistor including a gate electrode coupled to a second buffer node, a first electrode coupled to a VDD node, and a second electrode coupled to the second control node;
a transistor including a gate electrode and a first electrode coupled to the VDD node, and a second electrode coupled to the second buffer node;
a transistor including a gate electrode connected to the first control node, a first electrode coupled to the second buffer node, and a second electrode coupled to a second VSS node; and
a transistor including a gate electrode coupled to the first control node, a first electrode coupled to the second control node, and a second electrode coupled to a first VSS node.

20. The display panel of claim 16, wherein the control circuit includes:
a transistor including a gate electrode to which a line selection pulse is applied, a first electrode to which an input signal is applied, and a second electrode coupled to a first node;
a capacitor coupled between the first node and a VSS node;
a transistor including a gate electrode coupled to the first node, a first electrode coupled to a VDD node, and a second electrode coupled to a second node;
a transistor including a gate electrode to which a reset pulse is applied, a first electrode coupled to the second node, and a second electrode coupled to the first control node; and
a transistor including a gate electrode to which a start pulse is applied, a first electrode coupled to the first control node, and a second electrode coupled to the VSS node.

* * * * *

UNITED STATES PATENT AND TRADEMARK OFFICE
CERTIFICATE OF CORRECTION

| | | |
|---|---|---|
| PATENT NO. | : 11,882,742 B2 | Page 1 of 1 |
| APPLICATION NO. | : 17/901516 | |
| DATED | : January 23, 2024 | |
| INVENTOR(S) | : Ki Min Son et al. | |

It is certified that error appears in the above-identified patent and that said Letters Patent is hereby corrected as shown below:

In the Claims

Column 40, Claim 17, Line 31:
"having Ta source" should read: --having a source--.

Signed and Sealed this
Thirtieth Day of July, 2024

Katherine Kelly Vidal
*Director of the United States Patent and Trademark Office*